(12) United States Patent
Yu et al.

(10) Patent No.: US 9,389,952 B2
(45) Date of Patent: Jul. 12, 2016

(54) GREEN NAND SSD APPLICATION AND DRIVER

(71) Applicants: Frank Yu, Palo Alto, CA (US); Abraham C. Ma, Fremont, CA (US); Shimon Chen, Los Gatos, CA (US); Yao-Tse Chang, Taichung (TW); Yan Zhou, Wuhan (CN)

(72) Inventors: Frank Yu, Palo Alto, CA (US); Abraham C. Ma, Fremont, CA (US); Shimon Chen, Los Gatos, CA (US); Yao-Tse Chang, Taichung (TW); Yan Zhou, Wuhan (CN)

(73) Assignee: Super Talent Technology, Corp., San Jose, CA (US)

( * ) Notice: Subject to any disclaimer, the term of this patent is extended or adjusted under 35 U.S.C. 154(b) by 52 days.

(21) Appl. No.: 14/543,472

(22) Filed: Nov. 17, 2014

(65) Prior Publication Data

US 2016/0139982 A1    May 19, 2016

(51) Int. Cl.
| | |
|---|---|
| *G11C 29/00* | (2006.01) |
| *G06F 11/10* | (2006.01) |
| *G11C 14/00* | (2006.01) |
| *G06F 12/14* | (2006.01) |
| *H03M 13/11* | (2006.01) |
| *G11C 29/52* | (2006.01) |

(52) U.S. Cl.
CPC ........ *G06F 11/1016* (2013.01); *G06F 11/1072* (2013.01); *G06F 12/1408* (2013.01); *G11C 14/0018* (2013.01); *G11C 29/52* (2013.01); *H03M 13/1191* (2013.01); *G06F 2212/1052* (2013.01)

(58) Field of Classification Search
CPC ............ G06F 11/1016; G06F 11/1068; G06F 1/1072; G06F 11/1076; G06F 12/1408; G06F 3/0619; G11C 29/52; G11C 29/65; G11C 14/0018
See application file for complete search history.

(56) References Cited

U.S. PATENT DOCUMENTS

| | | | | |
|---|---|---|---|---|
| 2012/0284587 | A1* | 11/2012 | Yu | ............... G06F 3/0608 714/773 |
| 2013/0145085 | A1* | 6/2013 | Yu | ............... G06F 12/0246 711/103 |

OTHER PUBLICATIONS

Ken Takeuchi, High reliable low power solid state drives, 2012, IEEE, pp. 1 to 2.*

(Continued)

*Primary Examiner* — Shelly A Chase
(74) *Attorney, Agent, or Firm* — WHGC, P.L.C.; John F. O'Rourke

(57) ABSTRACT

A GNSD (Green NAND Solid State Drive) Driver coupled to host DRAM, and having a memory manager, a data grouper engine, a data ungrouper engine, a power manager, and a flush/resume manager. The GNSD driver is coupled to a GNSD application, and the host DRAM to a Non-Volatile Memory Device. The GNSD Driver further includes a compression/decompression engine, a de-duplication engine, an encryption/decryption engine, or a high-level error correction code engine. The encryption/decryption engine encrypts according to DES (Data Encryption Standard) or AES (Advanced Encryption Standard). A method of operating a GNSD Driver and a GNSD application coupled to DRAM of a host, includes coupling: Configuration and Register O/S Settings to the host and the GNSD Application; a data grouper and data ungrouper to the host DRAM and to Upper and a Lower Filter; a power manager and a memory manager to the host; a flush/resume manager to the DRAM; and the DRAM to an (Super Enhanced Endurance Device) SEED SSD (Solid State Drive).

20 Claims, 17 Drawing Sheets

(56) References Cited

OTHER PUBLICATIONS

Yu Cai, et al., Error Patterns in MLC NAND Flash Memory: Measurement, Characterization, and Analysis, Date 2012.

Yuan Chen, Flash Memory Reliability NEPP 2008 Task Final Report, Jet Propulsion Laboratory, JPL Publication 09-9 Mar. 2009, Pasadena, CA.

Jon G. Elerath, Demystifying Reliability of Hard Disk and Solid-State Drive, Diskcon Asia-Pac 2008.

Robert Sykes, Critical Rold of Firmware and Flash Translation Layers in Solid State Drive Design, OCZ Technology, Flash Memory Summit 2012, Santa Clara, CA.

Joseph Chen, Creating Effective SSD Test Suites, ULINK Technology, Inc., Flash Memory Summit 2013, Santa Clara, CA.

Keunsoo Jo & Doug Wong, Flash Technology: 200-400Mbps and Beyond, Samsung Electronics Co. Ltd and Toshiba, Flash Storage Summits 2010.

Esther Spanjer, Realities of Solid State Storage, Storage Netowrking Industry Association, Apr. 2013.

Jim Cooke, The Inconvenient Truths of NAND Flash Memory, Micron Technology, Inc., Flash Memory Summit Aug. 2007, Santa Clara, CA.

Michael Abraham, NAND Flash Architecture and Specification Trends, Micron Technology, Inc., Flash Memory Summit Aug. 2012, Santa Clara, CA.

Hewlett-Packard Development Company, L.P., Understanding endurance and performance characteristics of HP solid state drives, Apr. 2012.

TDK, Serial ATA 3Gbps Compatible NAND-Type Flash Memory Controller IC GBDriver RS4 Series.

Atsushi Inoue & Doug Wong, NAND Flash Applications Design Guide, Toshiba America Electronic Components, Inc., Apr. 2003.

Paul Von Behren, SNIA NVM Programming Model, Sep. 2013.

Shimin Chen, et al., DFTL: A flash translation layer employing demand-based selective caching of page-level address mappings.

Dongzhe Ma, Jianhua Feng, Fuoliang Li, LazyFTL: A Page-level Flash Translation Layer Optimized for NAND Flash Memory, Department of Computer Science and Technology Tsinghua University, Beijing, China, Jun. 12-16, 2011.

Jim Handy, How Controllers Maximize SSD Life, Solid State Storage Initiative, Jan. 2013.

\* cited by examiner

```
                    DEVICE IO CONTROL define  IOCTL_DISK_FORMAT   CTL_CODE(IOCTL_DISK_BASE, 0x807, METHOD_BUFFERED, FILE_ANY_ACCESS)

define CTL_CODE( DEVICETYPE, FUNCTION, METHOD, ACCESS ) ( \
    ((DEVICETYPE) << 16) | ((ACCESS) << 14) | ((FUNCTION) << 2) | (METHOD) \
)

#define  IOCTL_DISK_BASE              FILE_DEVICE_DISK
define  FILE_DEVICE_DISK             0x00000007 define  FILE_DEVICE_BEEP             0x00000001
define  FILE_DEVICE_CD_ROM           0x00000002
#define  FILE_DEVICE_CD_ROM_FILE_SYSTEM  0x00000003
#define  FILE_DEVICE_CONTROLLER       0x00000004
#define  FILE_DEVICE_DATALINK         0x00000005
#define  FILE_DEVICE_DFS              0x00000006
#define  FILE_DEVICE_DISK             0x00000007
#define  FILE_DEVICE_DISK_FILE_SYSTEM 0x00000008
#define  FILE_DEVICE_FILE_SYSTEM      0x00000009
#define  FILE_DEVICE_IMPORT_PORT      0x0000000a
......

#define  METHOD_BUFFERED              0
#define  METHOD_IN_DIRECT             1
#define  METHOD_OUT_DIRECT            2
define  METHOD_NEITHER               3 define  FILE_ANY_ACCESS              0
define  FILE_SPECIAL_ACCESS          (FILE_ANY_ACCESS)
#define  FILE_READ_ACCESS             (0x0001)    // FILE & PIPE
define  FILE_WRITE_ACCESS            (0x0002)    // FILE & PIPE ┌─────────────────────────────┐
                                                    │ IOCTL_DISK_REWRITE_COUNT    │
                                                    │ IOCTL_DISK_SEND_IRP         │
                                                    │ IOCTL_DISK_READ_TABLE       │
                                                    │ IOCTL_DISK_FLUSH_ALL        │
                                                    │ IOCTL_DISK_WRITE_COUNT      │
                                                    │ IOCTL_DISK_FLUSH_ONE        │
                                                    │ IOCTL_DISK_FORMAT           │
                                                    │ IOCTL_DISK_CLEARDRAM        │
                                                    │ IOCTL_DISK_READ_PARAMETER   │
                                                    │ ......                      │
                                                    └─────────────────────────────┘
                                                                                    ⎿1400
```

FIG. 14

GREEN NAND SSD APPLICATION AND DRIVER

CROSS REFERENCE TO RELATED APPLICATIONS

This application is related to "Endurance and Retention Flash Controller with Programmable Binary-Levels-Per-Cell Bits Identifying Pages or Blocks as having Triple, Multi, or Single-Level Flash-Memory Cells", U.S. Ser. No. 13/788,989, filed on Mar. 7, 2013; "Virtual Memory Device (VMD) Application/Driver with Dual-Level Interception for Data-Type Splitting, Meta-Page Grouping, and Diversion of Temp Files to Ramdisks for Enhanced Flash Endurance", U.S. Ser. No. 13/730,797, filed on Dec. 28, 2012; "Super-Endurance Solid-State Drive with Endurance Translation Layer (ETL) and Diversion of Temp Files for Reduced Flash Wear", U.S. Ser. No. 13/540,569, filed on Jul. 2, 2012; "High Performance and Endurance Non-volatile Memory Based Storage Systems", U.S. Ser. No. 12/141,879, filed Jun. 18, 2008; and "Green NAND Device (GND) Driver With DRAM Data Persistence For Enhanced FLASH Endurance And Performance", U.S. Ser. No. 13/927,435, filed Jun. 26, 2013, in which each of the foregoing disclosures is hereby incorporated by reference herein in its entirety, and all of which are assigned to the same assignee hereof.

1. FIELD OF THE INVENTION

The invention generally pertains generally to flash memory and, more particularly, to methods and apparatus to improve the endurance of flash memory.

2. BACKGROUND ART

Hard Disks with rotating magnetic platters are being replaced with more reliable Solid-State Drive (SSD) using semiconductor flash memory. NAND flash memory uses electrically-erasable programmable read-only memory (EEPROM) cells that store charge on a floating gate. Cells are typically programmed by an avalanche current, and then erased using quantum mechanical tunneling through a thin oxide. Unfortunately, some electrons may be trapped in the thin oxide during program or erase. These trapped electrons reduce the charge stored in the cell on subsequent program cycles, assuming a constant programming voltage. Often the programming voltage is raised to compensate for trapped electrons.

As the density and size of flash memory has increased, the cell size and its reliability and lifetime have all been reduced. The number of program-erase (P/E) cycles that a single-level flash memory is guaranteed to be able to withstand is about 100,000 cycles, which allows for a lengthy lifetime under normal read-write conditions. However, the smaller flash cells have experienced a disturbingly higher wear. Newer two-level cell flash memories may have an endurance of less than 10,000 P/E cycles, and Triple-Level Cells (TLC) may have an endurance of between about 500 to about 1,500 P/E cycles. If current trends continue, future flash memories may only allow for 300 program-erase cycles. Such a low endurance could severely limit implementations of flash memory, and applications for SSD. A high-endurance SSD drive and endurance-enhancing methods are needed.

SUMMARY

The present embodiments provide devices and methods. The devices include a Green NAND Solid State Drive (GNSD) Driver coupled to host DRAM, the GNSD Driver having a memory manager, coupled to an Upper filter; a data grouper engine coupled to the host DRAM; a data ungrouper engine coupled to the host DRAM; and a power manager coupled to the memory manager; and a flush/resume manager coupled to the memory manager. The GNSD driver is coupled to a GNSD application, and the host DRAM is coupled to a Non-Volatile Memory Device. In embodiments, the GNSD Driver further includes of a compression/decompression engine, coupled to a File System filter; a de-duplication engine, coupled to a File System filter; an encryption/decryption engine, coupled to a File System filter; or a high-level error correction code engine, coupled to a File System filter. In embodiments using a encryption/decompression engine, the encryption/decryption engine is configured to encrypt according to one of a Data Encryption Standard or an Advanced Encryption Standard.

The present embodiments also include a GNSD Driver coupled to DRAM of a host, which includes a data grouper; a data write cache of the DRAM, coupled to the data grouper; a data ungrouper; and a data read cache of the DRAM, coupled to the data ungrouper. The data grouper and the data ungrouper are coupled to an Upper Filter and a Lower Filter. The GNSD driver is coupled to a GNSD application. The DRAM is coupled to a Non-Volatile Memory Device. In embodiments, the GNSD Driver also can include a compression/decompression engine, coupled to the Lower filter; a de-duplication engine, coupled to the Lower filter; an encryption/decryption engine, coupled to the Lower filter; or a high-level error correction code engine, coupled to the Lower filter. The GNSD Driver can also have a SMART data monitor, coupled to a super enhanced endurance device SSD; and a security engine, coupled to the host. The high-level error correction code engine uses one of a graph-based code or an algebraic code. In an embodiment, the high-level error correction code engine employs a low-density parity code graph-based code. The data grouper and data ungrouper are each coupled to a metapage grouper for user data; a metapage grouper for FDB; and a metapage grouper for pagefile pages.

Embodiments further provide a GNSD application coupled to host DRAM, which includes an SSD housecleaning module coupled to the GNSD driver; a DRAM allocation module coupled to the GNSD driver; a driver installation module coupled to the GNSD driver; or a cache mode on/off switch coupled to the GNSD driver.

Embodiments provide a computer system host having a GNSD driver coupled to a data grouper and a data ungrouper in the computer system host; and a GNSD application coupled to the GNSD driver and to the computer system host. In such embodiments, the data grouper and the data ungrouper of GNSD Driver are coupled to an Upper Filter and a Lower Filter of the computer system host, and the computer system host is coupled to a Non-Volatile Memory Device. Embodiments also may include Configuration and Register O/S Settings coupled to the computer system host.

Embodiments of the present invention can include a method of operating a GNSD Driver and a GNSD application coupled to DRAM of a host, which includes coupling Configuration and Register O/S Settings to the host and to the GNSD Application; coupling a data grouper engine of the GNSD driver to the host DRAM; coupling a data ungrouper engine of the GNSD driver to the host DRAM; coupling a power manager of the GNSD driver to the host; coupling a memory manager of the GNSD driver to the host; coupling a flush/resume manager of the GNSD driver to the DRAM; coupling the data grouper engine and the data ungrouper engine of the GNSD driver to an Upper Filter and a Lower Filter; and coupling the DRAM to an Super Enhanced Endurance Device (SEED) SSD. The method also can include one of disabling drive indexing, disabling drive search indexing, reducing page file size, disabling system restore, disabling hibernate, disabling prefetch, reducing recycle bin size, disabling defragmentation, reducing logging; and disabling per-formance monitoring, disabling write caching, or disabling write cache buffer flushing. The SEED SSD endurance is increased to more than specified and write amplification is reduced to less than specified.

In embodiments, the method also can include synchronizing a weak table to a weak table of blocks of the SEED SSD; generating high level error correction code (ECC) data for page data in the weak table, providing generated high level ECC data; storing the generated high level ECC data in one of a cache area in the host DRAM, or in a spare portion of the SEED SSD; and writing the page data indicated by the weak table. The method can continue by reading data in a page by the ECC engine and, if the data in the page is determined to be corrupted by the SEED SSD native ECC engine, then reading by the ECC engine the generated high level ECC data of the weak table to which the corrupted page data pertains; and correcting the corrupted page data with the generated high level ECC data using the ECC engine.

In embodiments, the method further can include grouping user data into a first metapage; grouping system FDB into a second metapage; grouping pagefile pages into a third metapage; and storing the first second, and third metapages to a SEED SSD storage volume. In embodiments, the method can include providing an Endurance Translation Layer (ETL) controlling access to flash memory in a SEED SSD and to a DRAM buffer; inspecting, by the ETL, a block of flash memory, and either identifying, by the ETL, the block as a bad block if the total error bits exceed a predetermined high level threshold, or entering, by the ETL, the block into a weak table if the total error bits exceed a predetermined low level threshold; and synchronizing the weak table to the GNSD Driver coupled to the DRAM.

Embodiments of the present invention also can include a method of increasing endurance of a non-volatile flash memory, including coupling a GNSD Driver having an ECC engine to host DRAM; coupling a SEED SSD to host DRAM; generating high level ECC for selected data in the SEED SSD using the host DRAM; and using the high level ECC to correct corrupted data from the SEED SSD. Embodiments of the method further can include synchronizing a weak table to a weak table of blocks with the SEED SSD; generating high level error correction code (ECC) data for page data in the weak table, producing generated high level ECC data; storing the generated high level ECC data in one of a DRAM cache area or a spare portion of the SEED SSD; and writing the page data indicated to the weak table. Embodiments of the method of increasing endurance of claim 18, can include reading data in a page; if the data in the page is corrupted by the SEED SSD native ECC engine, then reading the generated high level ECC data of the weak table to which the page pertains, and correcting the corrupted data in the page with the generated high level ECC data.

BRIEF DESCRIPTION OF THE DRAWINGS

The invention is generally shown by way of reference to the accompanying drawings in which:

FIG. 14 is a representative example of SSD I/O control coding, in accordance with the teachings of the present invention;

Some embodiments are described in detail with reference to the related drawings. Additional embodiments, features and/or advantages will become apparent from the ensuing description or may be learned by practicing the invention. In the figures, which are not drawn to scale, like numerals refer to like features throughout the description. The following description is not to be taken in a limiting sense, but is made merely for the purpose of describing the general principles of the invention.

DESCRIPTION

A Green NAND SSD Driver (GNSD) application and a GNSD driver executing on a host may block, combine, or buffer to DRAM, writes before they reach the flash memory, thus reducing the write frequency to the flash memory. A green or low-power flash device may use low-endurance NAND flash memory. A GNSD application and a GNSD driver on the host create and manage multiple caches on both the host and on an SSD, which may have low-endurance flash memory. Low-endurance flash memory may include, without limitation, triple-level cell (TLC) NAND flash memory. The GNSD application and the GNSD Driver operate with the SSD and the host to transform the SSD into a super-endurance flash drive, or Super Enhanced Endurance Device (SEED) SSD. Examples herein may apply to the Windows® operating system by Microsoft, Redmond, Wash., USA, but similar examples mutatis mutandi may apply to other operating systems.

Figure 1:
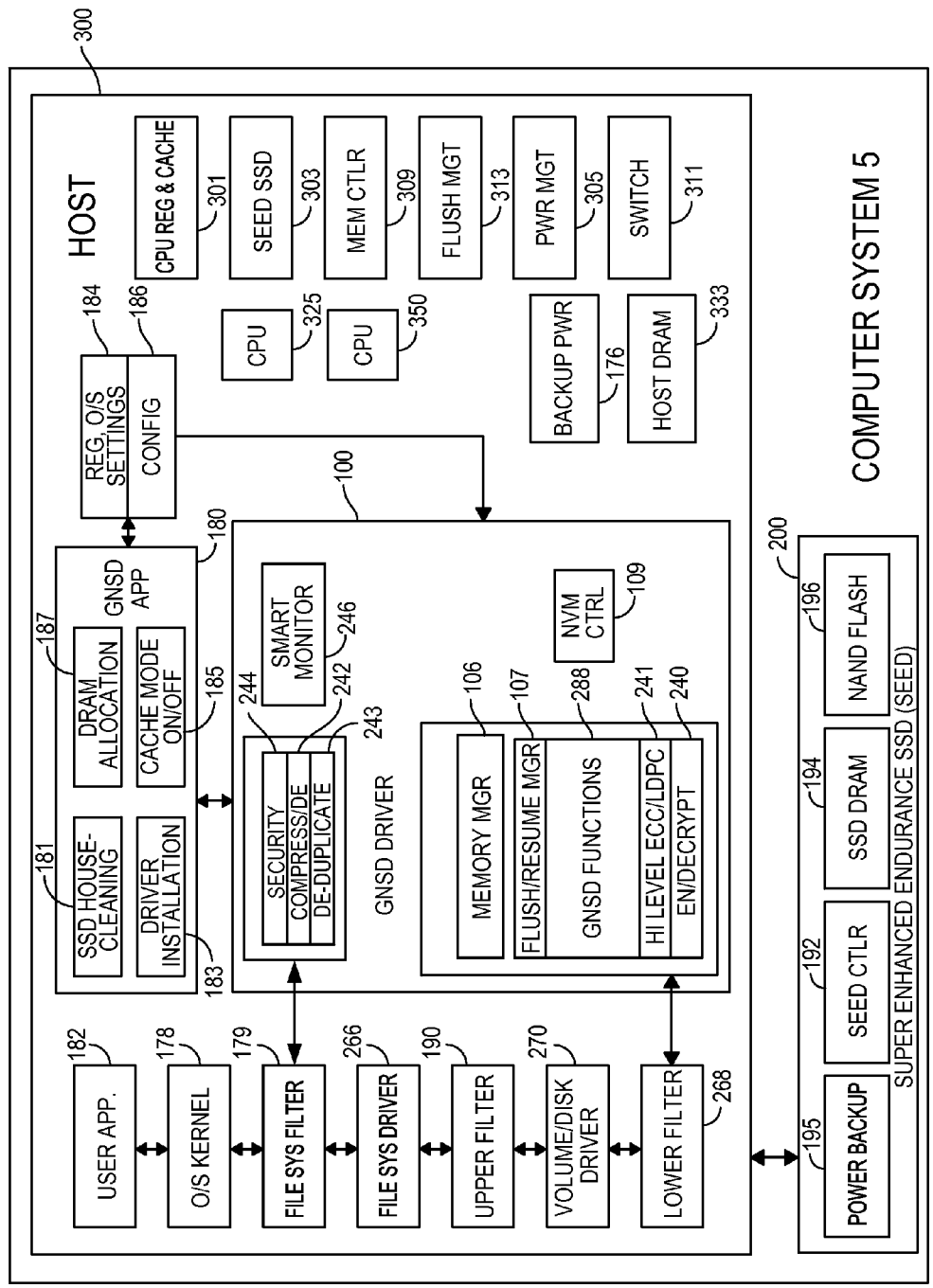
FIG. 1 is a block diagram of a computer system, in accordance with the teachings of the present invention.
Figure 2:
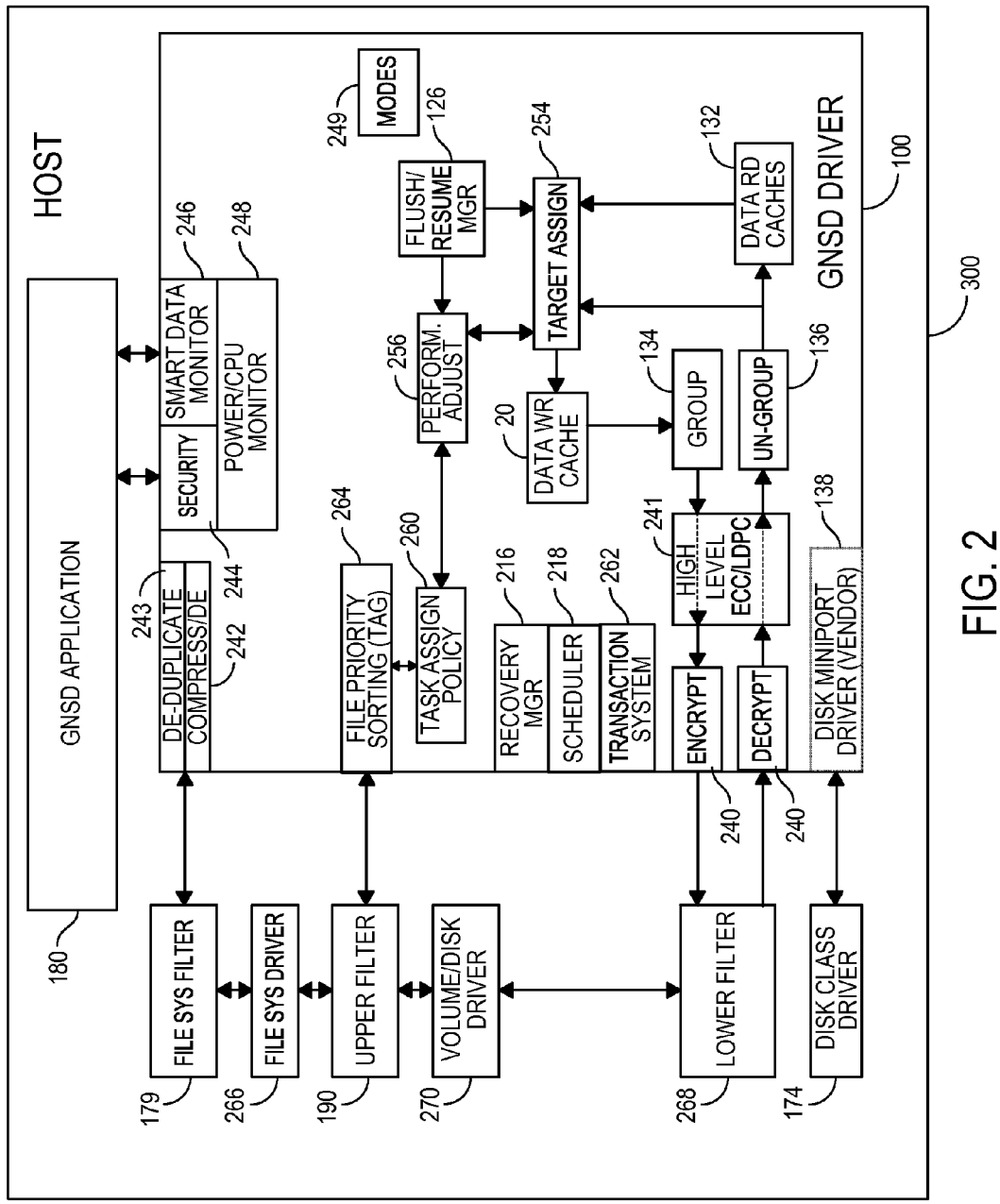
FIG. 2 is a block diagram of a host having a Green NAND SSD Driver (GNSD), in accordance with the teachings of the present invention.

Referring to FIGS. 1 and 2, computer system 5 can include host 300, and SEED SSD 200. Host 300 can include GNSD Driver 100, which can be coupled to GNSD Application 180. GNSD driver 100 may have memory manager 106, and flush/resume manager 107. In addition, GNSD driver 100 may include encryption/decryption engine 240, high-level ECC engine 241, a compression/decompression engine 242, a de-duplication engine 243, and a security engine 244.

"MEMORY MGR" 106 can provide many functions such as "DRAM Clear" which reset the DRAM cache area controlled by the GNSD DRIVER. "Trim Command" which is an OS command to SSD 200 to actually remove the data from flash memory. For GNSD Driver, it can use the command to remove the data from DRAM 333, if it is cached. "Format Snooper" can let the format command pass through to the SSD 200 without any intervention. "Smart Flush" can flush data from DRAM 333 to SSD 200, dependent on the user selection of "forever" (i.e., not using AutoFlush), 30 seconds, 1 minute, or 5 minutes, etc. The default is not using Auto Flush (i.e., "forever") to maximize DRAM 333 effectiveness. Also, it can flush selected DRAM cache data (such as cold data) to SSD 200 when the DRAM cache usage reached to a predefined level. When auto flush is selected, a predefined watermark can be set for the flushed DRAM cache data and the data remained in the DRAM. The DRAM cache data is overwritten only when the DRAM cache area are full.

"FLUSH/RESUME MGR" 107 provides way of quickly flushing the DRAM data into SSD 200 when it powers off/fails and restores the data from SSD 200 to DRAM when power back on. It also flushes the DRAM 333 to SSD 200 when the DRAM cache reaches a predefined water mark. If the Host has no activity to the SSD 200, the GNSD driver 100 can write DRAM cache data to SSD 200 based on user selected option. When power goes off or fails, the dirty data in the DRAM cache, e.g., SSD DRAM 194, will be saved to SEED SSD as an image file. This way it will be faster to go through all the standard operations. At power resume, the image can be read and reinstalled as last time.

GNSD driver 100 functions 288 are provided for improved endurance and performance of the SEED SSD in conjunction with configuration and OS settings. Below are details of GNSD driver 100 functions 288 for improved endurance and performance with configuration and OS settings:

Disabling Drive Indexing: SSD 200 seek function is fast, about 0.1 ms, and indexing may not be needed.

Disabling Drive Search Indexing: Disabling Search Indexing can help increase both the performance and longevity of the SSD. Disabling this option prevents Windows® OS from trying to keep track of every file for search purposes. A drawback could be that SSD searches may be slower.

Reducing page file size: Leave page file on the SSD but set it to a fixed and "reasonable" size. The Operating System (OS) can allocate a page file to be the same size as installed DRAM 333. For a large-size DRAM machine, the OS may quickly consume SSD space. The OS pagefile function performs well on the SSD, depending on the amount of DRAM 333 in the system. It may be set it to, for example, 1 or 2 GB in size. When setting the value of the pagefile file, it may be that the parameters are set to the same, fixed, minimum and maximum values, reflecting a balance between available space on SSD 200 and how much DRAM 333 is available and regularly used.

Disabling System Restore: The System Restore feature allows for software installations, drivers and other updates to be rolled back. Disabling this feature can free between several hundred megabytes and several gigabytes of memory. The amount of disk space System Restore can use may be reduced, or even turned off completely, at the risk of not being able to automatically recover from problems caused by system changes. However, if this feature is disabled, the user should use some other form of backup, such as creating a disk image backup.

Disabling Hibernate: SSD 200 space may be freed, up to the amount of DRAM 333, by disabling the Hibernation feature in the Windows® operating system. By default, the size of the hibernation file (hiberfil.sys) is the same as the amount of installed DRAM 333 on the computer. Naturally, disabling the Hibernate function can prevent the user from using this power-saving mode, and from gaining the benefit of quick boots and shutdowns. However, the Hibernate mode provides no real benefit to SSD 200 due to quick SSD load time of 10-20 seconds, which, in some cases, may equal that of Hibernation. Even so, the user can elect to enable the Hibernate function by selecting it from the shutdown menu.

Disabling Write Caching: By disabling write caching and by using GNSD driver 100 caches, GNSD driver 100 can use its caches fully when a backup power is available.

Turning Off Write-Cache Buffer Flushing: Turning off write-cache buffer flushing may increase the performance of SSD.

Disabling Prefetch: SSDs have extremely low seek times and no rotational delay, so access times are not dependent of the location of particular segments. Therefore, Prefetch loses its main purpose. In addition, reducing writes to SSD 200 can be part of optimizing its performance, so Prefetch may be disabled.

Setting Superfetch to Cache boot only: An improved way to use Superfetch may be to set to cache boot files only. Superfetch does have a purpose and just turning it completely off can only gain some disk space, particularly if the cached files are deleted after disabling. Disabling Superfetch can cause a busy machine to slow down as it swaps applications from disk to RAM. Just because an SSD is being used, doesn't mean swapping won't occur or won't be noticeable.

Reducing the Recycle Bin size: Set recycle bin to a fixed and small size. The Windows® OS can set the size used as about 10% of the SSD size. Other recycle bin sizes may be set.

Using a smaller size such as, for example, 300 MB can help to free up space and reduce writes to SSD.

Reducing logging: Operating System (OS) writes extensive event logs. With the exception of some necessary logs (EventLog-Application, Security, System, Security Essentials), some logs can be safely stopped that write to the drive periodically.

Disabling Windows® Reliability Monitor: This performance monitor provides an overview of hardware and software problems over time. It writes to the drive on events, and every hour. If the OS is on the SSD, the activities of monitoring can slow down a stable system.

If "SMART Monitor" 246 detects there is no activity from Host to SSD 200, it can flush a user selected amount of DRAM data cache to SSD 200, if the "AutoFlush" enabled. It can make a mark to DRAM data cache depending on the number of writings, then based on the number of writings, arrange the priority of flush order. Security 244 may perform a password verification process before allowing access to SEED SSD 200 or data cached by GSND driver 100. SMART data monitor 246 sends S.M.A.R.T. monitoring information from SEED SSD 200 to SSD application 180.

GNSD application 180 can have multiple functions, four of which may include, without limitation:

SSD housecleaning 181 in GNSD application 180 performs various high-level functions such as garbage collection, and removing old or unused files. SSD housecleaning 181 may be performed periodically, such as, without limitation, daily, or weekly.

"DRAM Allocation" 183 in GNSD application 180 which allocates and initializes DRAM capacity from the OS for using with GNSD Driver 100 and returning DRAM to OS when GNSD Driver exist or when cache mode is shut down.

"Cache Mode ON/OFF" 185: With Cache Mode OFF in GNSD application 180, GNSD driver 100 can flush all DRAM cache data to SSD 200 and remain in active. With Cache Mode ON, GNSD driver 100 can set up the DRAM cache environment. In "Consequence Host access (read/write) to Device": the IRP can be passed down to next driver directly. With Cache Mode ON, the GNSD driver can read parameters from "Registration Table" and set up the DRAM cache environment. "Consequence Host access (read/write) to Device," the IRP can pass down to GNSD driver. Note that, when "Flush All" command received, GNSD driver can turn Cache Mode to OFF first, after the flush finished, it can turn the Cache Mode to ON. With Cache Mode OFF, "Consequence Host access (read/write) to Device", the IRP access will be bypassing the GNSD driver and passed down to the next driver directly. With Cache Mode ON, "Consequence Host access (read/write) to Device" will be diverted to GNSD driver and DRAM cache.

"Cache mode on": if cache mode status is off, read parameters from regedit registry editor and do memory request and allocation from OS.

"Cache mode off": if cache mode status is on, flush all cache in DRAM or clear DRAM based on user's instruction, then free allocated memory back to OS.

"Driver Installation" 187 in GNSD application 180 installs the user selected SSD 200 driver when GNSD driver started. The SSD 200 can be, without limitation, a USB SSD, a SATA SSD, a PCIe SSD, or an M.2 SSD. Other SSD 200s also may be used.

Super Enhanced Endurance Device (SEED) SSD 200 can include, without limitation, NAND flash memory 196, and SEED controller 192; SEED 200 also may include SSD DRAM 194 and power backup 195. SEED controller 192 in SEED SSD 200 may store the data in SSD DRAM buffer 194 and then to NAND flash memory 196, for example, on power down, or when SSD DRAM buffer 194 is full.

Host 300 has processor 325 that executes instructions for programs such as user apps 182 and for an operating system (OS) kernel 178 such as Windows®, Linux, Apple OS, Android, or other operating system kernel. Host 300 also may include a second processor 350, which acts as a secondary or auxiliary processor. Processor 350 also may be one part of a multicore system. GNSD application 180 can be an application executing, for example, on host 300. GNSD application 180 and GNSD driver 100 can be used to ease the loads of Super Enhanced Endurance Device (SEED) SSD 200. GNSD application 180 and GNSD driver 100 can work together to separate data such as temporary files, paging files etc., that are not meant to be permanently stored to flash. GNSD driver 100 can manage cache to store such temporary (Temp) data. Cache may be part of the host's DRAM 333.

GNSD driver 100 diverts writes from host 300 to caches in host DRAM 333 and/or in SSD DRAM 194, particularly when sufficient backup power can be provided. Data from user apps 182 that are written by OS kernel 178 can be intercepted by upper-level file filter driver 190 and passed to GNSD driver 100 for compression and/or de-duplication by compression engine 242 and/or deduplication engine 243, respectively, before being sent to file system driver 266. Encryption/decryption engine 240 can use, for example, one of the AES and DES encryption techniques (See FIG. 5). Then low-level file filter driver 268 again intercepts the data for more processing by GNSD driver 100, such as for storage in cache 301.

File priority sorting 264 sorts the data based on the data type assigned by low-level file filter driver 268, or indicated by the Logical Block Address, such as for meta-data (FAT/FDB), temp files, paging files, or user data. FAT represents file allocation table, and FDB, file descriptor block. Temp files include Windows® OS temporary files, internet browser temporary files, etc. Alternately, the function can be optionally disabled for certain uses, such as for a server. Operations can be given a priority by task priority assignor 260 so that higher priority tasks may be performed ahead of lower-priority tasks. Performance adjustor 256 may periodically adjust these priorities to improve performance. Target assignor 254 may then send the data to data write cache 20.

Data that is finally ready to be written to SEED SSD 200 can be sent from GNSD driver 100 to volume manager 270, which manages storage volumes such as, for example, SEED SSD 200. SEED controller 192 in SEED SSD 200 may store the data in SSD DRAM buffer 194 and then to NAND flash memory 196, for example, upon power down or when SSD DRAM buffer 194 is full.

Transaction system 262 ensures that data can be written completely to SEED SSD 200. Recovery manager 216 determines which write transactions were not completed, for example, due to an abnormal power off, and helps applications to do the necessary redo or undo operations to make the data persistent. Therefore, recovery manager 216 is intended to ensure that no mistakes occur during a transaction, particularly in the face of a power disturbance during the transaction. Scheduler 218 manages transaction system 262 to manage and record write to SSD transactions such as start, abort, and commit.

File systems are initialized during the system boot process; specifically, during I/O system initialization. A file system filter driver 179 is an optional driver that adds value to or modifies the behavior of a file system. A file system filter driver 179 can be a kernel-mode component that runs as part of the Windows® OS executive. A file system filter driver 179 can filter I/O operations for one or more file systems or file system volumes. Depending on the nature of the driver, filter can mean log, observe, modify, select, or even prevent. Typical applications for file system filter drivers 179 may include compression program, antivirus utilities, encryption programs, and hierarchical storage management systems.

A file system filter driver 179 also may work in conjunction with one or more file systems to manage file I/O operations. These operations include creating, opening, closing, and enumerating files and directories; getting and setting file, directory, and volume information; and reading and writing file data. In addition, file system filter drivers 266, 190, 268 can support file system-specific features such as caching, locking, sparse files, disk quotas, compression, security, recoverability, reparse points, and volume mount points. Configuration settings 186, and registry and OS settings 184, may be set by OS kernel 178 or by GSND app 180 to define the size of caches or other system variables, and to manage preferred functions of GNSD application 180 and GNSD driver 100.

Security engine 244 may perform a password verification process before allowing access to SEED SSD 200 or data to be cached by GNSD driver 100. GNSD driver 100 may use the host CPU 325 to perform functions such as compression/decompression, de-duplication, and encryption/decryption. Smart data monitor 246 can send S.M.A.R.T. monitoring information from SEED SSD 200 to GNSD application 180. S.M.A.R.T. stands for Self-Monitoring, Analysis and Reporting Technology.

S.M.A.R.T. driver 39 works in conjunction with smart monitor 246 to process S.M.A.R.T. commands, or vendor commands, from host 300, such as to monitor and control error correction, wear, bad block, and other flash memory management. Host 300 can use the S.M.A.R.T. command sets from S.M.A.R.T. driver 39 to monitor some important data from the SSD device 200, such as, without limitation, power-on time, wear-leveling count, etc. Host 300 can use this data to diagnose and identify the life expectancy of SSD 200. It also can use the information to determine the warranty coverage based on the usage. Using the S.M.A.R.T. driver 39, host 300 can cause SSD drive 200 to be replaced before it experiences a hard failure, improving the overall up-time of computer system 5. In RAID arrangements, the host can use S.M.A.R.T. commands, for example, to avoid more expensive RAID 2, 5, or 6 configurations.

In SMART monitor 246 of FIG. 1, "Start Timer" activates timer when 1) triggered by AP to do autoflush; or 2) when driver starts and parameters cannot be read from regedit registry editor in the Windows® operating system (or similar functionality in other operating systems), then set timer to read parameters from regedit registry editor at regular intervals until success, then allocate memory.

Also in SMART monitor 246, "Stop Timer" is invoked to stop timer when 1) notice by AP to stop autoflush or 2) after the driver has read parameters from regedit Windows® registry editor and allocated memory.

De-duplication engine 243 finds and deletes duplicate copies of data files to reduce the write load. An engine such as compression/decompression engine 242 in GNSD driver 100, for example, can compress 128 sectors of data to 48 sectors of compressed data. These 48 sectors of compressed data include a header and some compressed data stored in a first compressed page, and two more pages of compressed data, for a total of 3 compressed pages. This can be a significant reduction from the uncompressed 8 pages. Configuration settings 186 and registry and OS settings 184 may have selected settings that may improve flash memory endurance and performance. For example, settings 184, 186 may enable or disable write caching, drive indexing, search indexing, defragmentation, host hibernation, prefetching, superfetching, and Windows® OS write cache buffer flushing Prefetching, indexing, hibernation, and defragmentation may cause additional writes to flash memory and reduce endurance. Thus, flash memory endurance may be improved by disabling these features. Also, write caching and write cache buffer flushing can disabled since GNSD Driver 100 has its own write caching and flushing functions.

Host backup power 176 provides power to host 300 when the main power source fails, enabling host 300 to send critical data from cache to SEED SSD 200 for storage in NAND flash memory 196, when power fails. Backup power 176 can use sources such as, without limitation, a battery, a supercapacitor, an uninterruptible power supply (UPS), or other backup source. Backup power 176 can be sized to give host processor 300 sufficient time to turn off applications and to properly shut down attached devices. SEED SSD 200 can have its own power backup 195, allowing SEED SSD 200 to write critical data to NAND flash memory 196 when the main power fails. Power backup 195 can utilize, without limitation, a capacitor, a super-capacitor, or a battery. Alternatively, if host backup power 176 has enough power to gracefully turn off the system, SSD power backup 195 in SEED SSD 200 may not be needed, such as when host 300 is a notebook computer or a Smart Phone.

Disk miniport driver 138 manages vendor-specific functions of the attached SSD's. Ungrouper engine 136 ungroups data that was retrieved from SEED SSD 200 before being transferred to data read caches. Write caching and write cache buffer flushing is disabled since the GNSD Driver has its own write caching and flushing functions. Thus flash endurance may be improved by disabling these features. Data that can be written to SEED SSD 200 may be grouped into a metapage by grouper engine 134 before being sent to volume manager 270 and, further, on to SEED SSD 200. By storing a metapage, the total number of writes to SEED SSD 200 may be reduced.

CPU register and cache controller 301 can write the CPU registers and caches to host DRAM 333 and then to SEED SSD 200, for example, when power fails. Switch 311, when preset, may isolate unnecessary components on host 300 so that they do not receive backup power, thus extending the period of backup power for critical components. Memory controller 309 may be present to transfer data between host DRAM 333 and SEED SSD 200 during abnormal power off and power restore.

SEED SSD 200 can have host interface 355, which communicates with host 300 using a bus such as a PCIe, SATA, USB, NVMe, Thunderbolt, eMMC, iSSD, etc. Host data from host interface 355 can be sent to SEED controller 192. SEED controller 192 performs a variety of functions to reduce the wear of NAND flash memory 196, such as by storing flushed files from GNSD driver 100 in host 300 in SSD DRAM buffer 194 and not in NAND flash memory 196.

SSD DRAM buffer 194 may store backups of host cache, and other data or tables flushed from GNSD driver 100. It may also store other data including meta-data, spare and swap blocks, tables for bad page management, and other buffers and tables. NAND flash memory 196 may store security information, tables, the file system for the SSD, and various other tables and buffers, in addition to user data and flushed cache. Some areas of NAND flash memory 196 may be reserved for bad blocks, or for over-provisioning. Host backup power supply 176, if present, may turn off power to the system and only provide power to SEED SSD 200. In case power management 305 is used, it may continue to provide power to the DRAM 333, SEED SSD 303, switch 311, and memory controller 309. Flush/resume manager 126 may periodically flush the contents of data write cache 20 to SEED SSD 200, for example, before power is lost.

After De-Duplication engine 243 finds and deletes duplicate copies of data files, then low-level file filter driver 268 can again intercept the data for more processing by GNSD driver 100. Alternatively, host 300 can pass the data type information through vendor commands to SEED SSD 200 so data split manager of SEED SSD 200 doesn't duplicate the work done by data split manager 108 OF GNSD driver 100. Alternately, this function can be optionally disabled for certain situations.

Examples of modes which exists in system 5 include, without limitation, power down mode, power-saving mode, and persistent mode. In power-down mode, computer system 5 goes through an orderly process of shut-down, flushing caches to SEED SSD drive 200. In a power-saving mode, sometimes referred to as "Sleep Mode," selected elements of computer system 5 are powered down, but others are left running, perhaps at reduced power. Selected caches may be written to SEED SSD drive 200 to preserve selected data. In Persistent mode, data is preserved just as if computer system 5 is in the Power-Saving Mode, but the computer system 5 is powered down. Although it exists, Hibernation mode typically is not used or is disabled, because all of the DRAM cache needs to be stored into SEED SSD 200, potentially causing unnecessary writes.

Figure 3A:
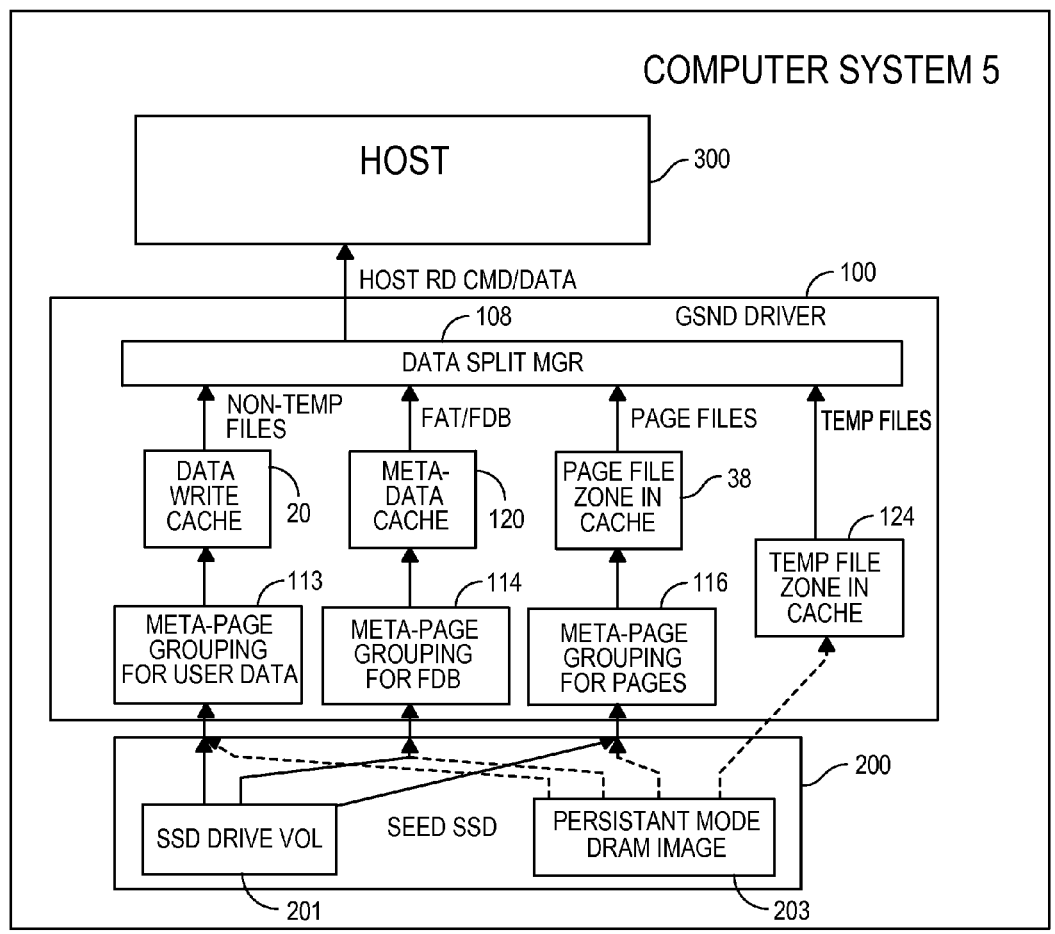
FIG. 3A is a functional block diagram of a computer system having a GNSD performing a host read function, in accordance with the teachings of the present invention.
Figure 3B:
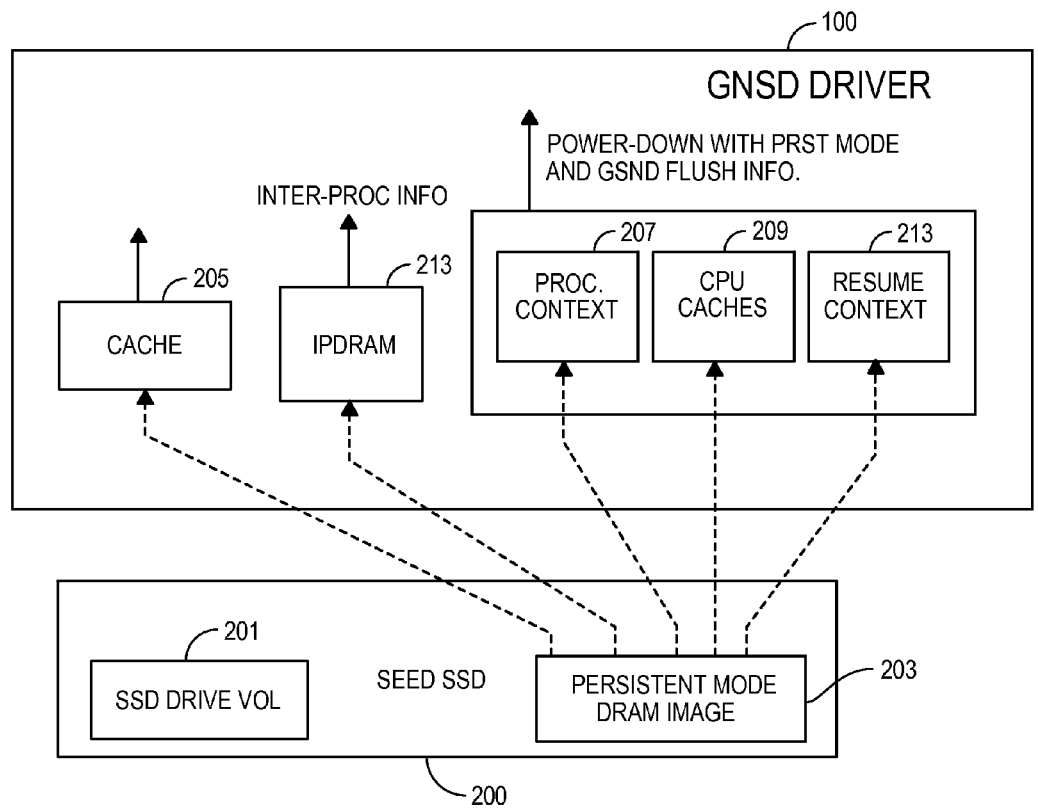
FIG. 3B is a functional block diagram of a GNSD performing a read operation from a Super Enhanced Endurance Device (SEED) SSD, in accordance with the teachings of the present invention.
Figure 3C:
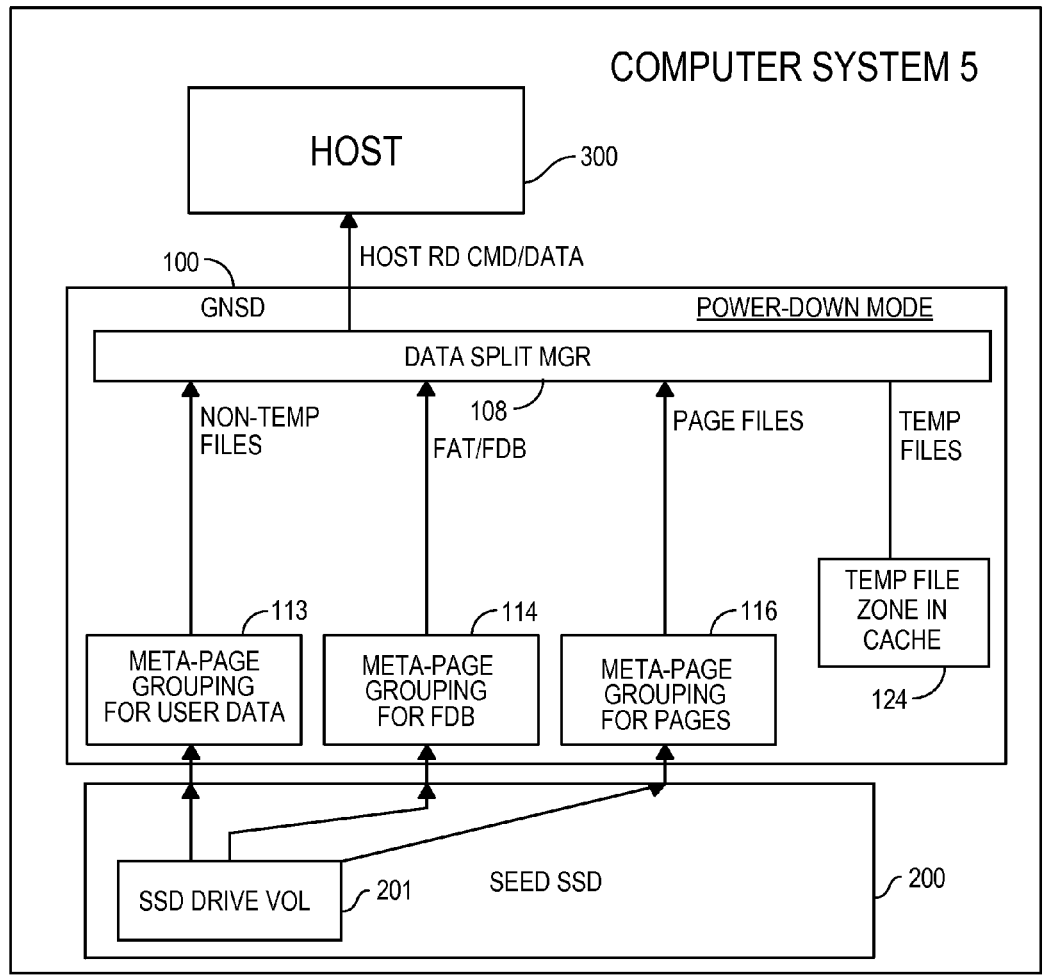
FIG. 3C is a functional block diagram of a computer system having a GNSD performing a host read function during power-down mode, in accordance with the teachings of the present invention.

As illustrated in FIGS. 3A, 3B, and 3C, data sorting and un-grouping for reads through the GNSD driver 100 for power down and persistent modes, host 300 sends a read command to data split manager 108, which also delivers host read data after de-duplication, decompression, or decryption by the respective de-duplication engine 243, decompression engine 242, or decryption engine 240. Data split manager 108 inside GNSD driver 100 sorts the host read data by data type and selects the data based on the data type.

The user data may have recently been written and may still be available from data write cache 20. Data may be stored in SSD drive volume 201 of SEED SSD 200 and can first be ungrouped by user data meta-page ungrouping process and loaded into data write cache 20. FAT/FDB data stored in SSD 200 drive volume is first ungrouped by FAT/FDB meta-page ungrouping process 116 before being placed in meta-data cache 120. A vendor command sent to SSD 200 can be used to disable some duplicated functions, such as de-duplication, compression, encryption, or data splitting that are performed by GNSD driver 100.

Many encodings of the data-type bits and other status fields, pointers, etc. are possible. The data-type status bits do not need to be the first bits in an entry. Entries could be linked to entries in other tables, such as having a separate table for tags or valid bits. Temporary files could have a variety of extensions, and new extensions could be added to the list to search. Temporary files created by well-known programs such as word processors and internet browsers have well-known files extensions, but additional extensions may be added at any time. These additional file extensions could be added through firmware updates to the control software for SEED SSD 200 controller 192, or by software updated to GNSD application 180 and GNSD driver 100. SEED controller 192 in SEED SSD 200 may store the data in SSD DRAM buffer 194 and then to NAND flash memory 196 on power down or when SSD DRAM buffer 194 is full.

For additional writes during persistent mode, or during power down mode, such as when power turns off or fails, caches can be copied to persistent mode DRAM image 203 but typically not to SSD drive volume 201. As shown in FIG. 3B, inter-processor (IP) information can be stored in IPDRAM 213 and copied to persistent mode DRAM image 203, but not to SSD drive volume 201. An Inter-Processor Memory (IPDRAM 213) can be used for the case when only selected DRAM contents are stored in persistent mode DRAM image 203. The first bytes may be a signature such as 0x55AA. Each record has a definition DEF filed that is 0x00 to indicate that the data pointed to by the record does not need to be backed up when power fails, 0x01 to indicate the need to back up the data pointed to, or 0xFF for the last valid record in the IPDRAM. Further detail can be implemented using the remaining numbers, 0x02 to 0xFE, to identify the different types of data such as 0x02 for processor context 207, 0x03 for Data Write Cache 20, etc. Each record also contains a pointer to indicate the starting address in the host DRAM, and a length field to indicate the total length of the related data. Each record will have I 0 bytes in total. For a 512 byte sector, it can hold 51 records. The 0xFF record is not necessary located at the last record.

When power fails, NVM CTRL 109 or a power-fail routine executed by CPU 325 may read each record of IPDRAM (in case of a partial store of DRAM) and decide whether to copy the data from DRAM to SSD when the DEF field is not 0x00 or 0xFF. The IPDRAM will be located at a fixed known address of DRAM so either CPU 325 or a second CPU 350, which may be internal or external, and NVM CTRL 109 will access the same location without confusion.

When power turns off or fails, and persistent mode is enabled, SSD driver 100 can flush and prepare information such as processor context 207, CPU caches 209, and resume context 213 to host DRAM 333 and update IPDRAM 213 before storing the DRAM data to persistent mode DRAM image 203. Battery or other backup power may be needed to finish writing data to persistent mode DRAM image 203 to keep alive for a period of time. Then this data may be retrieved from persistent mode DRAM image 203 when main power is restored. Note that the write data handled by the GNSD paging files stored in SSD drive volume 201 of SEED SSD 200 are typically the first to be ungrouped by paging-files meta-page ungrouping process, and loaded into paging zone 38 in the cache. Temp files may not be stored in flash memory and read from Temp file zone 124 in cache by data split manager 108. Using a persistent mode during power reboot, those caches and meta-page groupings 113, 114, 116 which are stored in persistent mode DRAM image 203, when power turns off or fails, can be loaded back to their same locations in DRAM 333. Cache may be copied from persistent mode DRAM image 203. Flush information such as processor context, CPU caches, and resume context are copied from persistent mode DRAM image 203.

As shown in FIG. 3C, in a power-down mode, SSD drive volume 201 provides user or non-temporary file data type in meta-pages grouped by meta-page user file grouping process. SSD drive volume 201 also provides paging file data type grouped into meta-pages by paging file grouping process 116, and File Description Block (FDB) data grouped into meta-pages by FDB meta-page grouping process. Temp files are stored in Temp file zone 124 in a cache and are lost, once power to the cache is depleted. FDB data can include a directory, subdirectory, FAT1, FAT2, etc.

Figure 4:
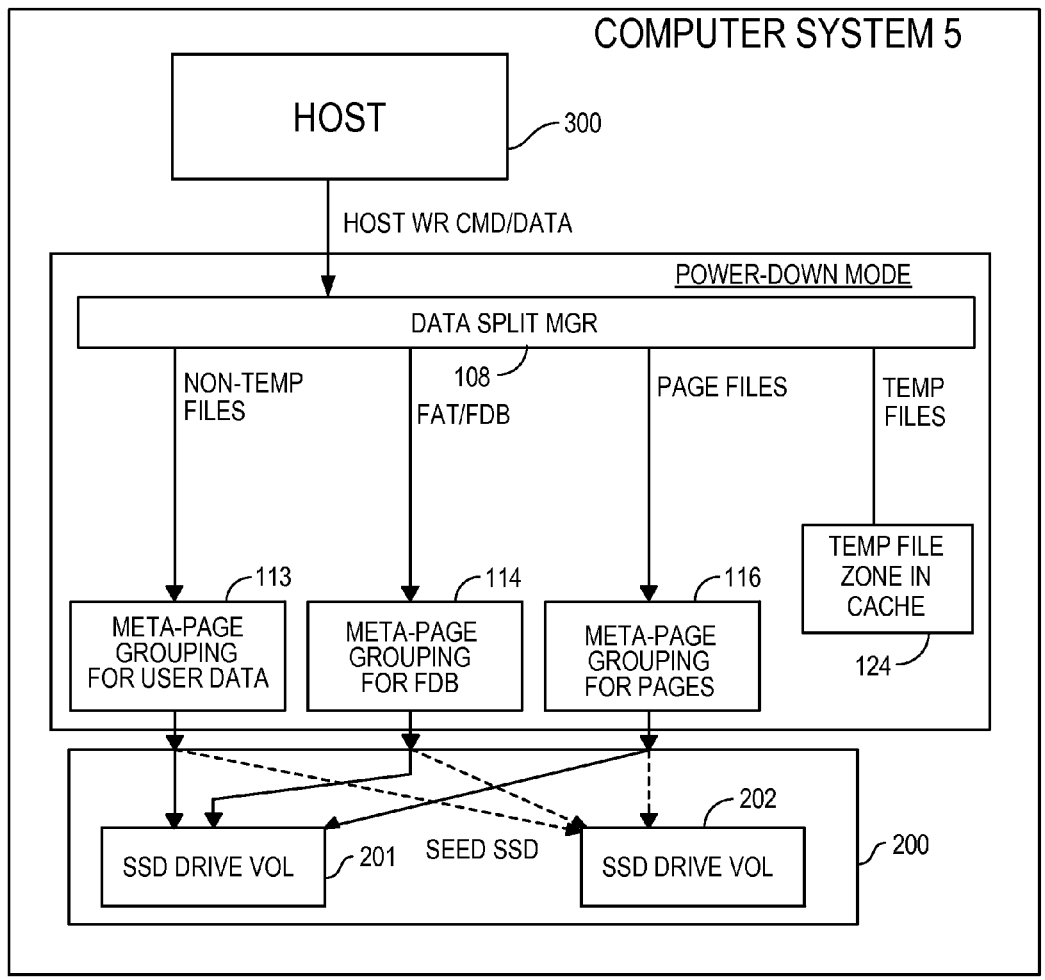
FIG. 4 is a functional block diagram of a computer system having a GNSD performing a host write function during power-down mode, in accordance with the teachings of the present invention.

A GNSD driver 100 typically cannot use DRAM caches to avoid the loss of critical data when power fails. As depicted in FIG. 4, during a host write during power down, data split manager 108 within GNSD driver 100 sorts the host write data by data type, such as by examining the file extension or by parsing the FAT and FDB. Temp files are stored in Temp file zone 124 in cache with a table entry being modified in meta-data cache 120. When power turns off or fails, Temp file zone 124 is stored in a persistent mode DRAM image in SSD DRAM 194 of SEED SSD 200. Alternately, temp files may not be stored in persistent mode DRAM image 203 in response to the user's selection.

For data splitting and grouping for writes through GNSD driver 100, host 300 sends a write command to data split manager 108 which also receives host write data after de-duplication, compression, or encryption by de-duplication engine or compression/encryption engine if enabled. De-duplication/compression table entries for the de-duplicated or compressed files or meta-page grouping tables may be modified in metadata cache in DRAM 333.

Also as illustrated in FIG. 4, SSD drive volume 201 can receive user or non-temporary file data type in metapages 113 grouped by meta-page user file grouping process. SSD drive volume 201 also receives paging file data type grouped into meta-pages by paging file grouping process 116, and FDB grouped into meta-pages by FDB meta-page grouping process 114. All of these three meta-page groupings 113, 114, 116 are sent to SSD drive volume 201 from host 300 once the corresponding meta-page is full during normal operation. The unfinished meta-page grouping 113, 114, 116 may be lost when power fails. Alternately, if the SEED SSD has a DRAM area 202 for the mirror image of these three meta-page groupings, the loss of data when power fails can be minimized. Temp files stored in a Temp file zone in cache 124 are lost when power turns off and fails.

Figure 5:
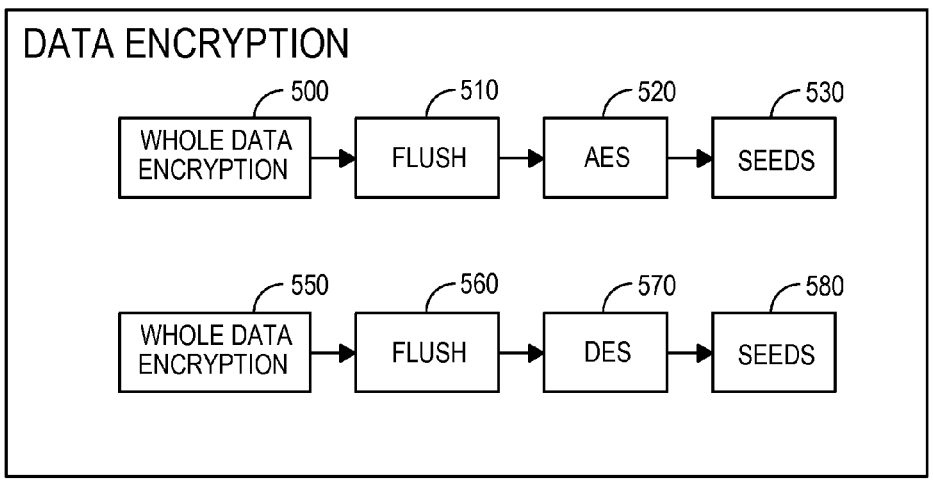
FIG. 5 is a high-level block diagram representation of DES/AES encryption, in accordance with the teachings of the present invention.

Encryption is illustrated in FIG. 5. The Data Encryption Standard is a previously predominant symmetric-key algorithm for the encryption of electronic data. It was highly influential in the advancement of modern cryptography in the academic world. Developed in the early 1970s at IBM and based on an earlier design by Horst Feistel, the algorithm was submitted to the National Bureau of Standards (NBS) following the agency's invitation to propose a candidate for the protection of sensitive, unclassified electronic government data.

The Advanced Encryption Standard (AES) is a specification for the encryption of electronic data established by the U.S. National Institute of Standards and Technology (NIST) in 2001. For AES, NIST selected three members of the Rijndael cipher family, each with a block size of 128 bits, but three different key lengths: 128, 192 and 256 bits.

AES has been adopted by the U.S. government and is now used worldwide. It supersedes the Data Encryption Standard (DES), which was published in 1977. The algorithm described by AES is a symmetric-key algorithm, meaning the same key is used for both encrypting and decrypting the data.

If encryption is enabled by user selection, it can be executed when the data is flushed/written to the flash memory device, for example by encryption engine 240. Encryption can be selected by a user for AES or DES encryption. In FIG. 5, whole data encryption 500 can be performed by flushing data, for example, from a cache, to the encryption engine 520. In one example, AES encryption 520 can be performed upon the data before it is stored to SEED SSD drive 530. Also, whole data encryption 550 can include a flush of data to encryption engine 240 to perform DES encryption 570 prior to the data being stored in SEED SSD drive 580. Decryption can be the reverse process of encryption. For example, if data read from flash memory device, decryption engine 240 can decrypt the previously encrypted data. Encryption engines 520 and 570 can be similar in function to encryption/decryption engine 240.

Figure 6:
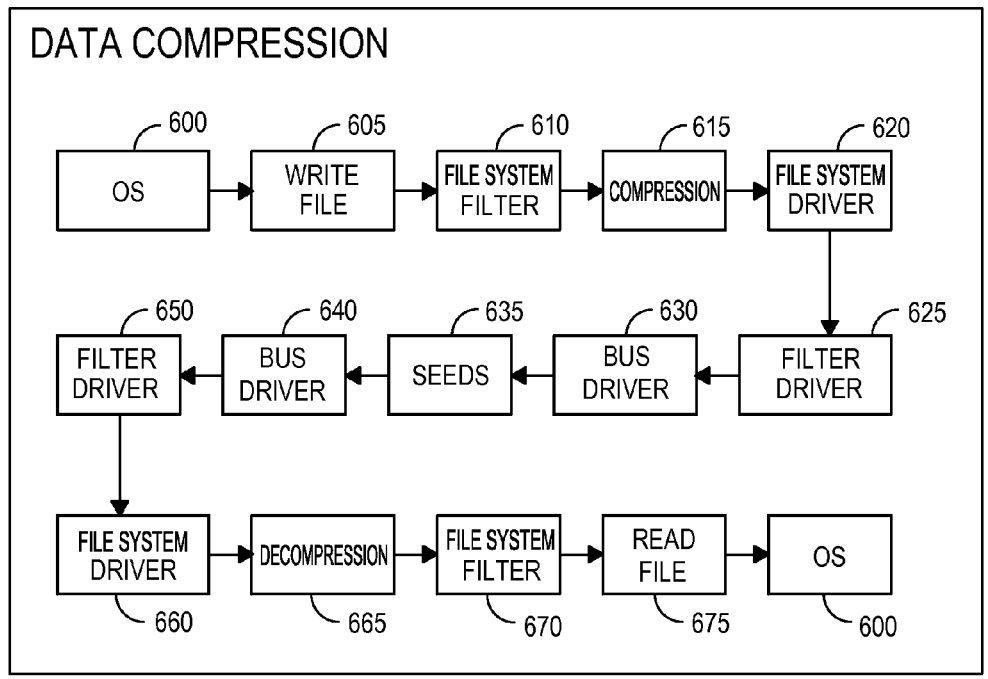
FIG. 6 is a high-level block diagram representation of data compression/decompression, in accordance with the teachings of the present invention.

FIG. 6 illustrates compression/decompression processes, which may be used by GNSD driver 100. If enabled by user selection, it can be executed when the data is written by the user Applications. The GNSD driver can compress the data before passing the data to the "File System Driver". (Then go to DRAM cache, then to flash memory device). When the data is read by the user Applications, the GNSD driver can decompress the data. De-duplication can be performed the same way as Data Compression.

Data compression is a technique for encoding data using fewer bits than the original data representation. Compression has the benefit of reducing storage to which data is written in the SEED SSD drive, thereby adding to its endurance. In an example of a compression for data written to a SEED SSD drive, operating system 600 may write a file 605 with the intended target of SEED SSD drive 635. SEED SSD drive 635 can be similar in function to SEED SSD 200. The written file 605 can be intercepted by file system filter 610, processed, and sent to compression engine 615 for compression. The compressed data may then be transported to filter system driver 620 and, in turn, to filter driver 625 and to bus driver 630, for storage on SEED SSD drive 635. Decompression for a read can be a reverse function of compression in that compressed data read from SEED SSD drive 635 can transport the compressed data to file system driver 660, by way of bus driver 640 and filter driver 650. File system driver 660 supplies decompression engine 665 with compressed data, which converts the compressed data into decompressed data. The decompressed data can then be intercepted by file system filter 670, which causes a read file operation 675, by which the Operating system 600 reads the uncompressed data. LZ methods are well-known in the art and may be a compression/decompression technique used by compression/decompression engine. Other well-known methods can be used, as well.

Figure 7:
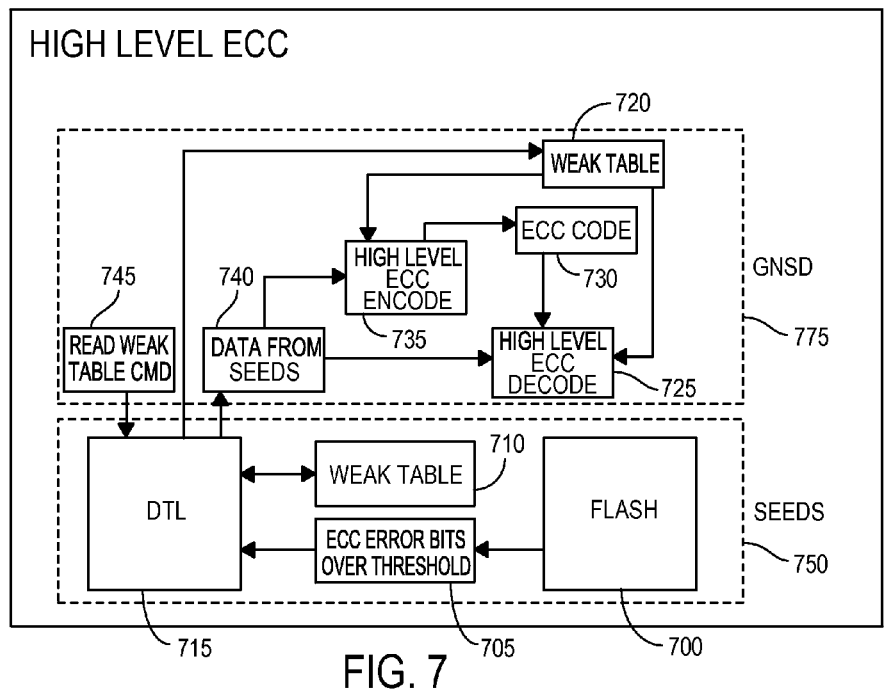
FIG. 7 is a block diagram of a GNSD driver interacting with a SEED during high-level error correction code operations, in accordance with the teachings of the present invention.

In FIG. 7, High Level ECC is illustrated. In order to enhance the endurance of SEED SSD Drive 750, GNSD driver 775 works with SEED SSD drive 750 to generate higher level ECC protection code to help the weaker pages to extend their life usage. The SEED SSD drive 750 can determine and manage the location of the degraded page, including those pages that no longer can be protected by the specified ECC level generated by the SEED controller 192. The GNSD driver 775 can use "Read weak table CMD" 745 to sync the "Weak table" 720 with SEED drive 700 weak table 710. DRAM Translation Layer (DTL) 715 can be DRAM in the SEED SSD drive 750 in which operations are performed by GNSD 775 in order to reduce unnecessary writes the flash 700. Whenever the GNSD driver 775 identifies the data that is going to be written to a page in the weak table 720, it can generate higher level ECC data for this page 735 and store the generated ECC data 730 in the DRAM cache area or spare portion of SEED drive 750. When the data is read back, if the SEED ECC reads without error, no additional work needs to be done. If the SEED ECC failed, it can send the corrupted data back to GNSD driver 775 and the GNSD driver 775 can retrieve the generated ECC data from the DRAM cache or from SEED drive 750. The generated ECC data can be used together with corrupted data to recover the corrected data.

In FIG. 7, "HI LEVEL ECC" can use LDPC (low-density parity-check) to provide higher level protection of data by generating additional bits of ECC protection by calculating LDPC codes and storing them in a spare area of SEED SSD. When the protected data reads with an error, i.e., the data cannot be recovered by the SSD device controller, the stored corresponding ECC/LDPC codes can be read and used to make the correction. Thus, using an efficient ECC like LDPC can improve endurance. Note that, in addition to graph-based codes like LDPC, algebraic codes such as, without limitation BCH, Hamming, and Reed-Solomon codes. LDPC codes, though, tend to be faster to generate and use less bits to protect the same size of data than other codes.

Figure 8:
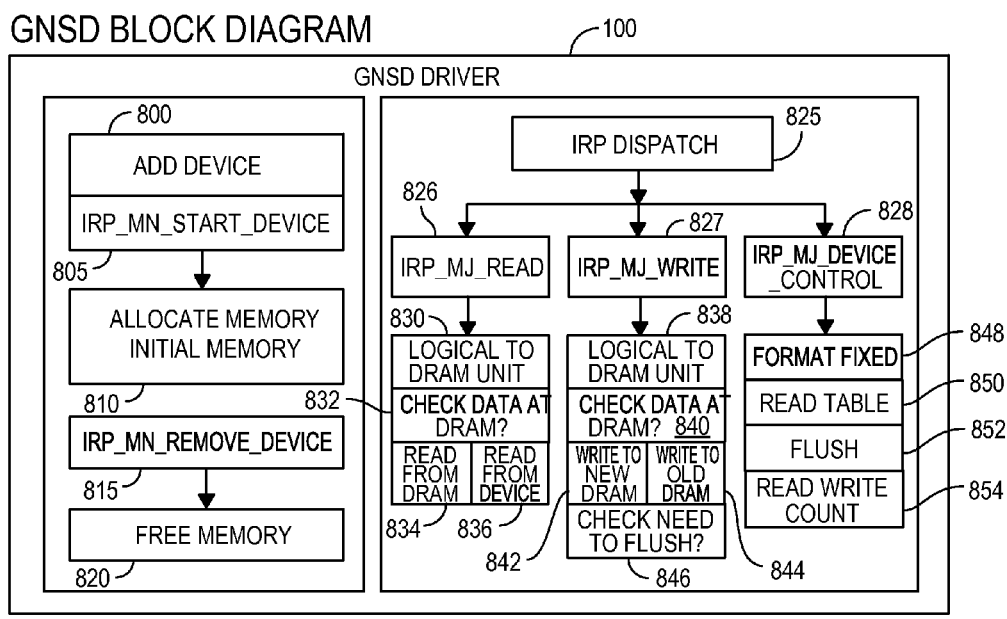
FIG. 8 is a block diagram representation of a GNSD performing an operation for an I/O request packet (IRP), in accordance with the teachings of the present invention.

GNSD driver 100 Block Diagram is illustrated in FIG. 8, in which:

"Add device" 800: GNSD driver creates and initializes a new filter device object for the corresponding physical device object.

IRP means an I/O REQUEST PACKET, as is commonly understood in the art, for example, in conjunction with Microsoft Windows®-based systems but which may be used with other operating system environments. Examples of IRPs include:

"IRP_MN_Start_Device" 805: Start the process to prepare the SSD 200 for GNSD driver.

"Allocate memory Initialize memory" 810: Request memory from Host's main memory from OS then initialize it for later use with GNSD driver.

"IRP_MN_Remove_Device" 815: Start the process to remove the SSD 200 from GNSD driver.

"Free memory" 820: Return the memory requested and allocated from Host's main memory back to OS.

"IRP Dispatch" 825: Identify which kind of IRP category. Read, Write, or Device Control. "IRP Dispatch" can include "IRP_MJ_Device_Control," "IRP_MJ_Read," and "IRP_MJ_Write."

"IRP_MJ_Read" 826: Read request by the I/O Manager or by a file system driver.

"Logic to DRAM unit" 830: 1. Check the "Logical to DTL" table to see any DRAM cache unit related to this unit; 2. If yes, check the "DTL to Logical", "DTL_Unit_Status", DTL_Unit_SEC_CNT, and "DTL_BitMapping" tables 832.

"Read from DRAM" 834: if "Logical to DTL" related, and the other three tables shown data is valid and all data in DRAM.

"Read from Device" 836: if no "Logical to DTL" related, or the other three tables shown data is not valid, or part of data in DRAM and part in SSD 200.

"IRP_MJ_Write" 827: Write request by the I/O Manager or by a file system driver.

"Logic to DRAM unit" 838: 1. Check the "Logical to DTL" table to see any DRAM cache unit related; 2. If yes, check the "DTL to Logical", "DTL_Unit_Status", and "DTL_BitMapping" tables 840.

"Write to new DRAM" 842: if "Logical to DTL" not related. Write the data to DRAM cache unused unit. Update all four tables.

"Write to old DRAM" 844: if "Logical to DTL" related. Overwrite the data to the pointed DRAM cache unit. Update the other three tables. "Check need to Flush?" 846: Check if the DRAM cache area being used but not send to SEED are over the predefined threshold level. If not over, do nothing. If over, flush selected DRAM cache unit and update the other three tables.

"IRP_MJ_Device_Control" 828: Device control operation by User Applications and GNSD driver.

"Format fixed" 848: If it is "Format" command, it need be updated to SEED device. Write operation: data can be written to DRAM and all four tables updated, then sent to device; Read operation: data can be read from device.

"Read table" 850: send max_dram_unit, Dram_Using, data of four tables to AP

"Flush" 852: "DRAM full flush", "IDLE flush" (ex: Idle >30 sec, flush 15 items/5 seconds), and "Safe remove" (GNSD AP "safe remove" button clicked, or computer power down, or task bar device safe remove clicked). All contributed to this.

"Read write count" 854: Count the read/write from user application and the actual read/write count to the SEED.

Figure 9:
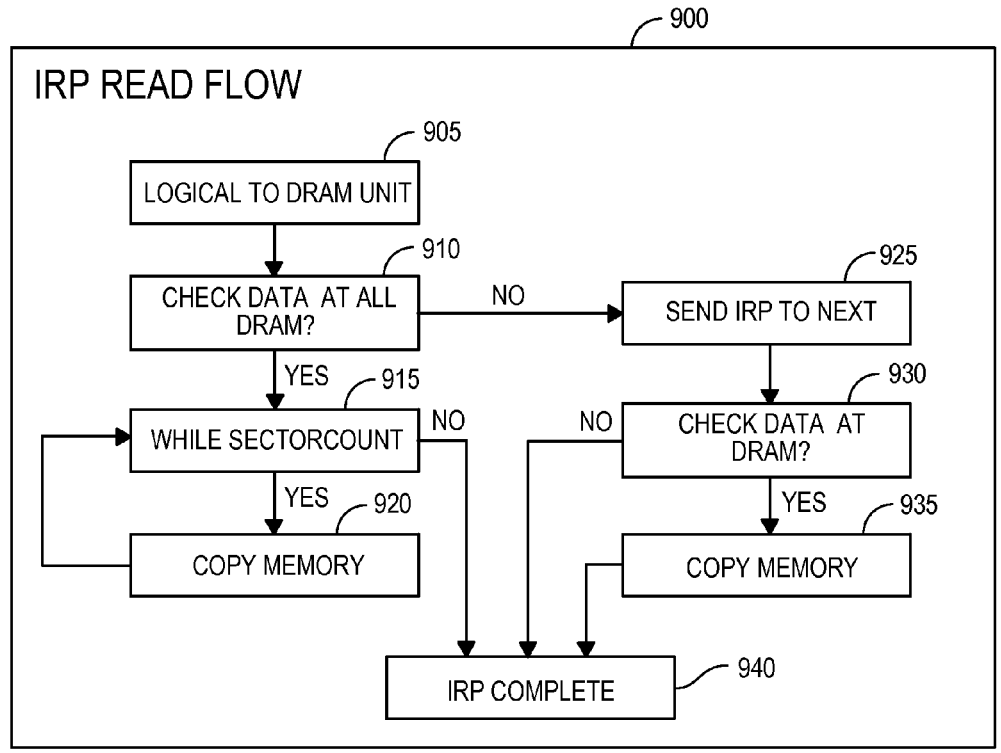
FIG. 9 is a block diagram representation of a GNSD IRP read flow, in accordance with the teachings of the present invention.

IRP read flow 900 is illustrated in FIG. 8, and also illustrated in FIG. 9, in which:

"Logical to DRAM unit" 905 is the data read from user application. "Check data all at DRAM?" 910 determines that the read data is located at DRAM cache.

If all data are located in DRAM cache, go to "While sectorCount" 915 process. If sector data read not finished, "Copy memory" 920 read data from the corresponding sector of DRAM cache unit out. After that, go back to "While sectorCount" 915.

If all sector of data has been read as requested by the user application, it can respond with "IRP complete" 940 to the user application.

If data are not all located in DRAM cache, "Send IRP to next" 925, set "GNSDReadComplete" routine, the next may be disk driver or disk upper filter. At this point "Check Data at DRAM" 930 verifies that valid data is in DRAM. If so, execute "Copy memory" 935 and it can respond with "IRP complete" 940 to the requester user application. If not, it can respond with "IRP complete" 940 to the user application.

Figure 10:
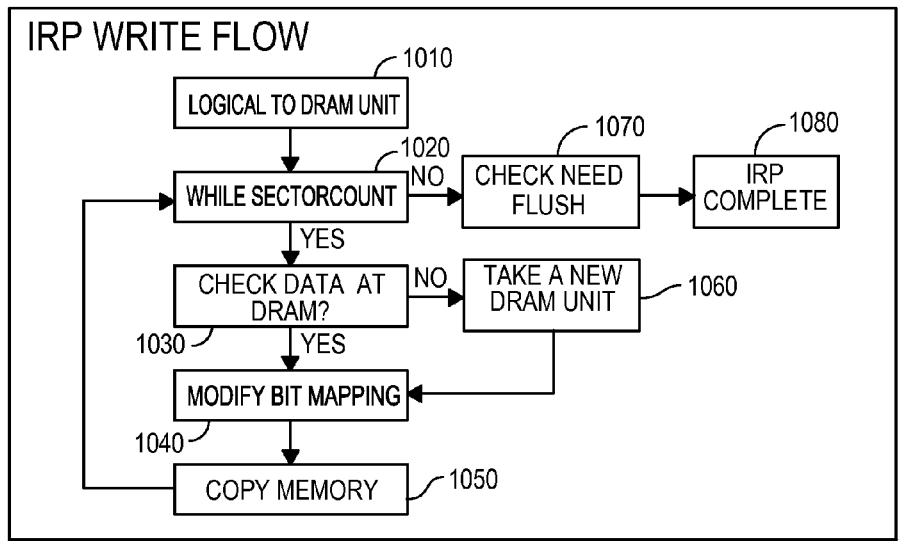
FIG. 10 is a block diagram representation of a GNSD IRP write flow, in accordance with the teachings of the present invention.

IRP write flow 1000 is illustrated in FIG. 8 and also is illustrated in FIG. 10, in which:

"Logical to DRAM unit" 1010 is the data write from user application. "While sectorCount" 1020 determines that the write data has all been written to DRAM cache unit.

If all written ("Check need flush" 1070), it can check if the DRAM cache area being used but not send to SEED are over the predefined threshold level. If not over, do nothing. If over, flush selected DRAM cache unit and update the other three tables. After done, it can respond with "IRP complete" 1080 to the user application.

If still have data not written to DRAM cache, it can "Check data at DRAM?" 1030 (determine if this is the beginning write of data unit). If this Logical Address data unit is not had an associated DRAM cache unit, it can map a new DRAM cache unit to this Logical Address (update "Logical to DTL" and "DTL to Logical" tables). Then go to "Modify bit mapping" 1040.

If it has an associated DRAM cache unit 1060, it can go to "Modify bit mapping" 1040.

"Modify bit mapping" 1040: It update the "DTL_BitMapping" and "DTL_Unit_Status" tables. Then "Copy memory" 1050 (copy the sector data from Logical Address to the corresponding sector of DRAM cache unit). Go to "While SectorCount" for unfinished data sectors.

Figure 11:
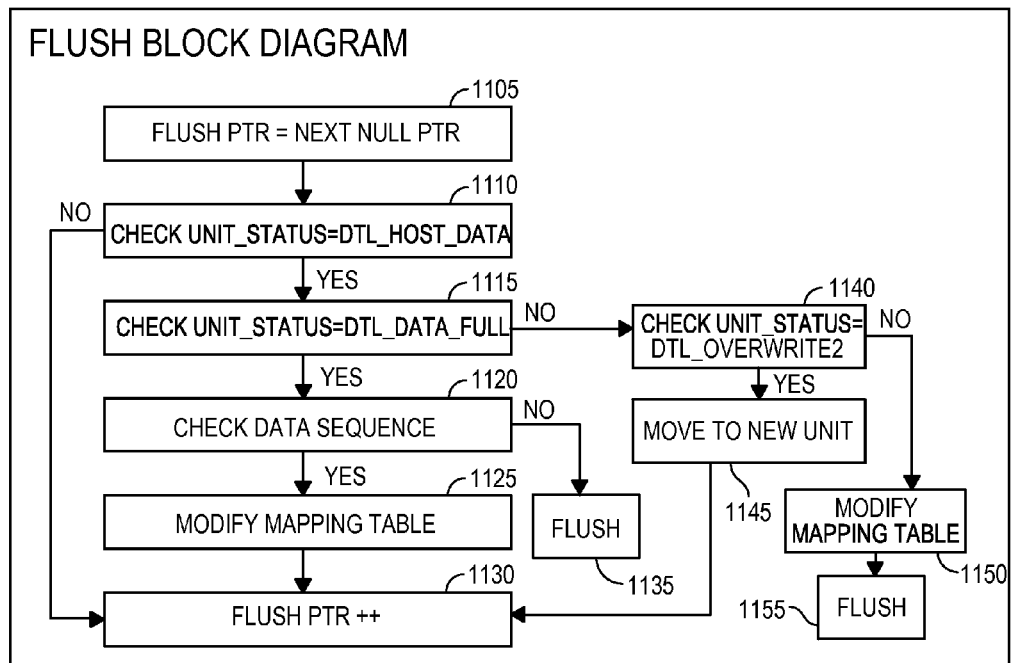
FIG. 11 is a block diagram representation of an GNSD flush block operation, in accordance with the teachings of the present invention.

Flush Block Diagram 1100 is illustrated in FIG. 11, in which:

"Flush PTR=Next Null PTR" 1105: let the Flush PTR point to the next empty DRAM unit "Check Unit_status=DTL_Host_Data" 1110 determines the DRAM cache unit data's status. If it is not Host Data?, go to "Flush PTR++" 1130 increase the flush pointer by 1.

If it is Host Data, "Check Unit_Status=DTL_Data_Full" 1115. If Data is not full, "Check Unit_status=DTL_Overwrite2" 1140, if it is overwrite2 status, "Move to new unit" 1145 move the data to new unit, go to "Flush PTR++" 1130 increase the flush pointer by 1.

If it is not overwrite2 status, "Modify mapping table" 1125 (Logical to DTL, DTL to Logical, DTL_Unit_status, DTL_BitMapping), then "Flush" 1135 the data to SEED device.

If Data is full, "Check data sequence" 1120, if "No" then "Flush" 1135 the data to SEED device.

If "Yes", "Modify mapping table" 1125 (Logical to DTL, DTL to Logical, DTL_Unit_status, DTL_BitMapping ?), then go to "Flush PTR++" 1130 increase the flush pointer by 1.

Figure 12:
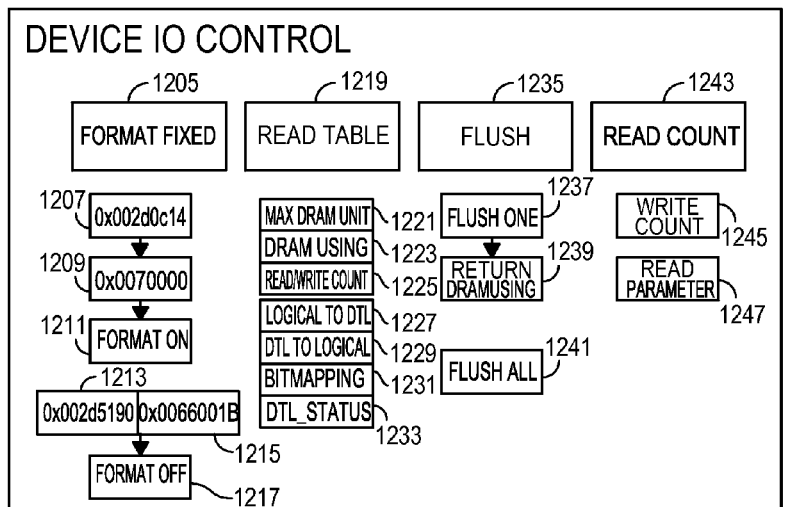
FIG. 12 is a block representation of SSD I/O control functions, in accordance with the teachings of the present invention.

Device IO control 1200 is illustrated in FIG. 12, in which:

"Format fixed" 1205: If IRP received are, for example, 0x002d0c14 1207 then 0x0070000 1207 or 0x002d0c14 then 0x0070000 then 0x002d1400, or x002d0c14 then 0x0070000 then 0x002d1400 then 0x002d1080, it indicates "Format on" 1211. Of course, the hexadecimal codes shown herein are for the purposes of example only, and other codes may be used.

If IRP received is 0x002d5190 1213 or 0x0066001B 1215, it indicates "Format off" 1217.

"Read table" 1219 send max_dram_unit, Dram_Using, data of four tables to AP.

"Max DRAM unit" 1221: Allocated DRAM unit count.

"DRAM Using" 1223: currently using DRAM unit count.

"Logical to DTL" table 1227: entry count is max DRAM unit, describes DRAM Unit address of each Logical Unit. "DTL" represents DRAM Translation Layer, which is a section of DRAM used to reduce unnecessary writes to Flash, as described elsewhere herein, for example, FIG. 19.

"DTL to Logical" table 1229: entry count is max DRAM unit, describes Logical Unit address of each DRAM Unit.

"DTL_bitMapping" table 1231: entry count is max DRAM unit, each entry describes one DRAM Unit, and every 1 bit of the item describes one LBA (Logical Block Address), 1 means the data of LBA is in DRAM, 0 means not in DRAM.

"DTL_Status" table 1233: entry count is max DRAM unit, and each entry describes the status of each DRAM Unit.

"Flush" 1235: write data from DRAM 333 to physical device.

"Flush one" 1237 do 15 consecutive flushes (Flush size depend on a calculation and is not fixed).

"Flush all" 1241 turn cache mode off then flush all data in DRAM.

"Read count" 1243: the number of times the driver enters into IRP_MJ_READ.

"Write count" 1245: the number of times the driver enters into IRP_MJ_WRITE.

"Read parameter" 1247 send total file system write count, total device write count, max_dram_unit, DRAM_Using, overwrite count, read count, write count to AP.

Figure 13:
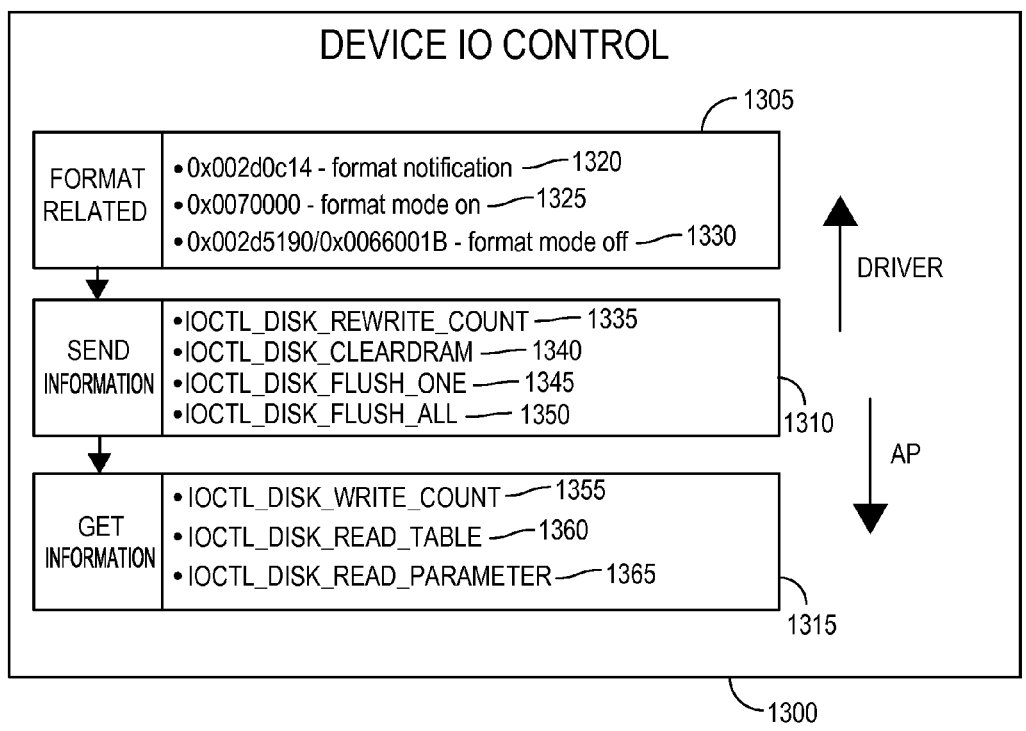
FIG. 13 is a block representation of SSD I/O control functions relative to a GNSD driver and a GNSD application, in accordance with the teachings of the present invention.

FIGS. 13-14 illustrate that I/O request packets (IRPs) are kernel mode structures that can be used by Windows® Driver Model (WDM) and Windows® NT device drivers, to communicate with each other, and with the operating system. Similar packets may be used by operating systems other than the Windows® operating system. FIG. 13 is a list of device type values, listed in alphabetical order, which may be used by the system I/O manager. FIG. 14 is a table of SSD control codes which may be used by the system for I/O control. IRPs are data structures that describe I/O requests, and can be equally well thought of as "I/O request descriptors" or similar. Rather than passing a large number of small arguments (such as buffer address, buffer size, I/O function type, etc.) to a driver, all of these parameters are passed via a single pointer to this persistent data structure. The IRP with all of its parameters can be put on a queue if the I/O request cannot be performed immediately. I/O completion is reported back to the I/O manager by passing its address to a routine for that purpose, IoCompleteRequest. The IRP may be repurposed as a special kernel APC object if such is required to report completion of the I/O to the requesting thread. IRPs are typically created by the I/O Manager in response to I/O requests from user mode. However, IRPs are sometimes created by the plug-and-play manager, power manager 305, and other system components, and can also be created by drivers and then passed to other drivers.

Figure 15:
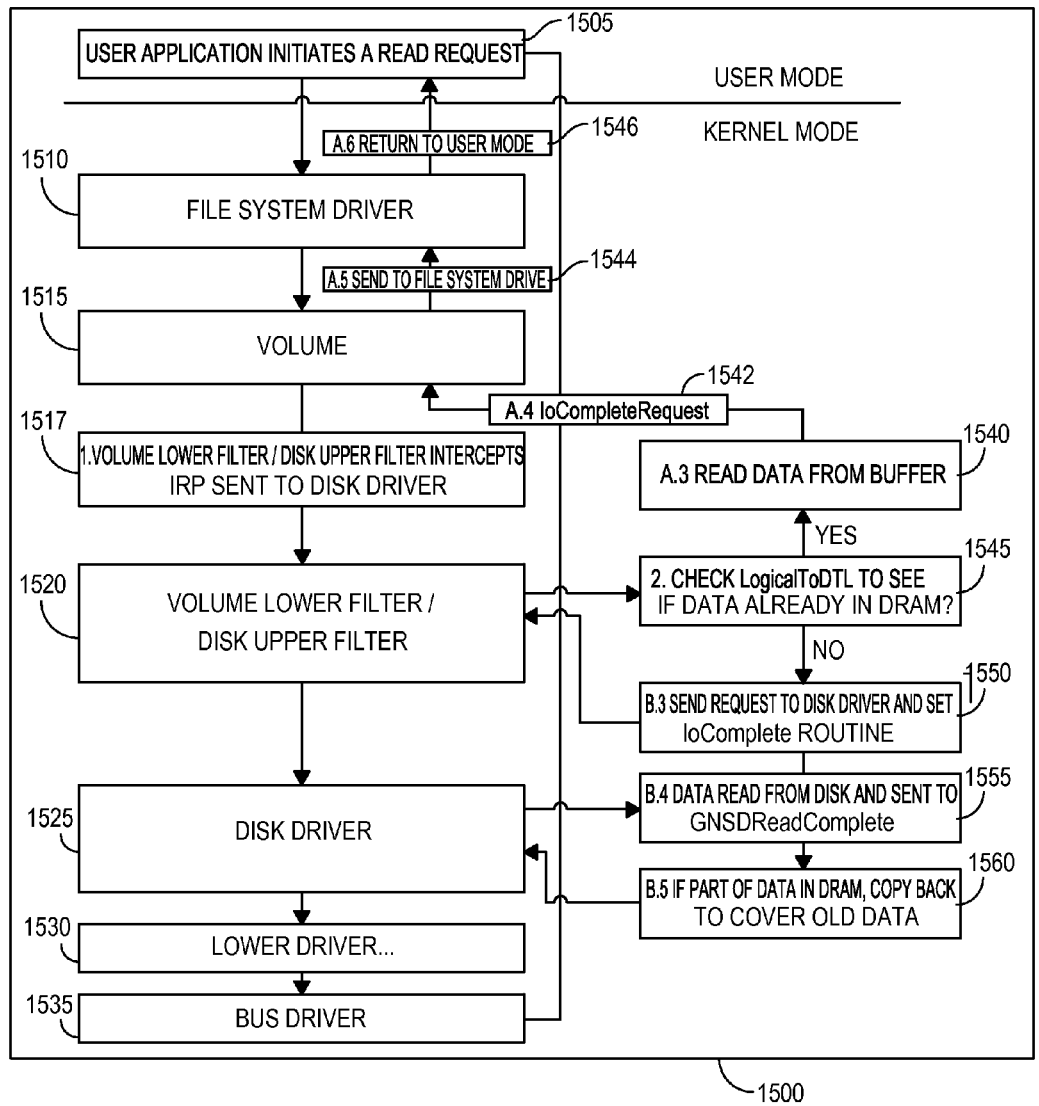
FIG. 15 is a block flow chart illustrating a user-initiated read request ("Read Dispatch"), in accordance with the teachings of the present invention.

Read Dispatch 1500 is illustrated in FIG. 15, in which:

In "User application initiates a read request" 1505 at user mode, file record information will be read from the subdirectory by the OS, which passes the information to "File System Driver" 1510 of Kernel mode. With GNSD driver implemented, the "Disk Upper Filter" intercepts IRP sent to "Disk Driver" from "File System Driver" (1.) 1517. The "Disk Upper Filter" can check "Logical to DTL" table, if data already in DRAM cache (2.) 1545, then it can read data from DRAM cache (A.3) 1540 and send "IoCompleteRequest" (A.4) 1542 together with data to "Volume", then to "File System Driver" (A.5) 1544, then send to User_Mode (A.6) 1546. If data is not in DRAM cache (2.) 1545, it can send request to "Disk Driver" and set IoComplete Routine (B.3) 1550. The data can read from Flash memory device and send to GNSDReadComplete (B.4) 1555. If part of data already in DRAM cache, it can update the read data in DRAM cache (B.5) 1560, the Disk Driver can send IRP to lower driver until at the end it returned to User Mode and finish the read dispatch routine.

Figure 16:
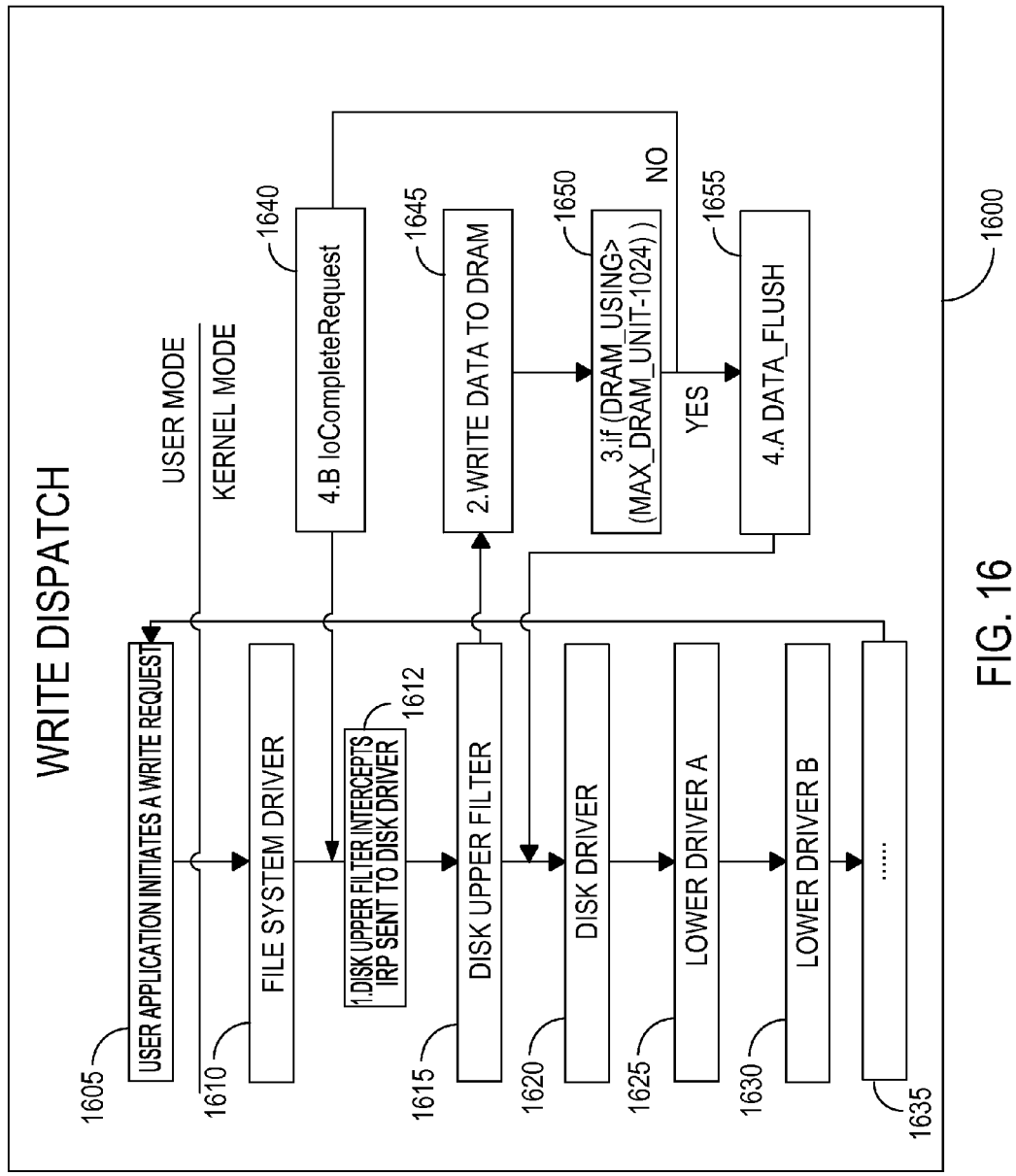
FIG. 16 is a block flow chart illustrating a user-initiated write request ("Write Dispatch"), in accordance with the teachings of the present invention.

Write Dispatch 1600 is illustrated in FIG. 16, in which:

In "User application initiates a write request" 1605 at user mode, the OS can write file record information to the current sub-directory, for example, and can pass the information to "File System Driver" 1610 of Kernel mode. With GNSD driver 100 implemented, the "Disk Upper Filter" 1615 intercepts IRP sent to "Disk Driver" 1620 from "File System Driver" (1.) 1612. The "Disk Upper Filter" can write data to DRAM cache and update "Logical To DTL" table (2.) 1645. Then it can check the DRAM cache usage (3.) 1650, if the usage is not over the predefined threshold (max_dram_unit-1024), it can send "IoCompleteRequest" (4.B) 1640 back to "File System Driver" 1610, and finish the write Dispatch routine. If the usage is over the predefined threshold (max_dram_unit-1024), it can perform predefine "Data Flush" (4.) 1655 and send flushed data to Flash memory device through "Disk Driver" 1620, the Disk Driver can send IRP to lower driver A 1625 and lower driver B 1630 until at the end 1635, it returned to User Mode and finish the write dispatch routine.

Figure 17:
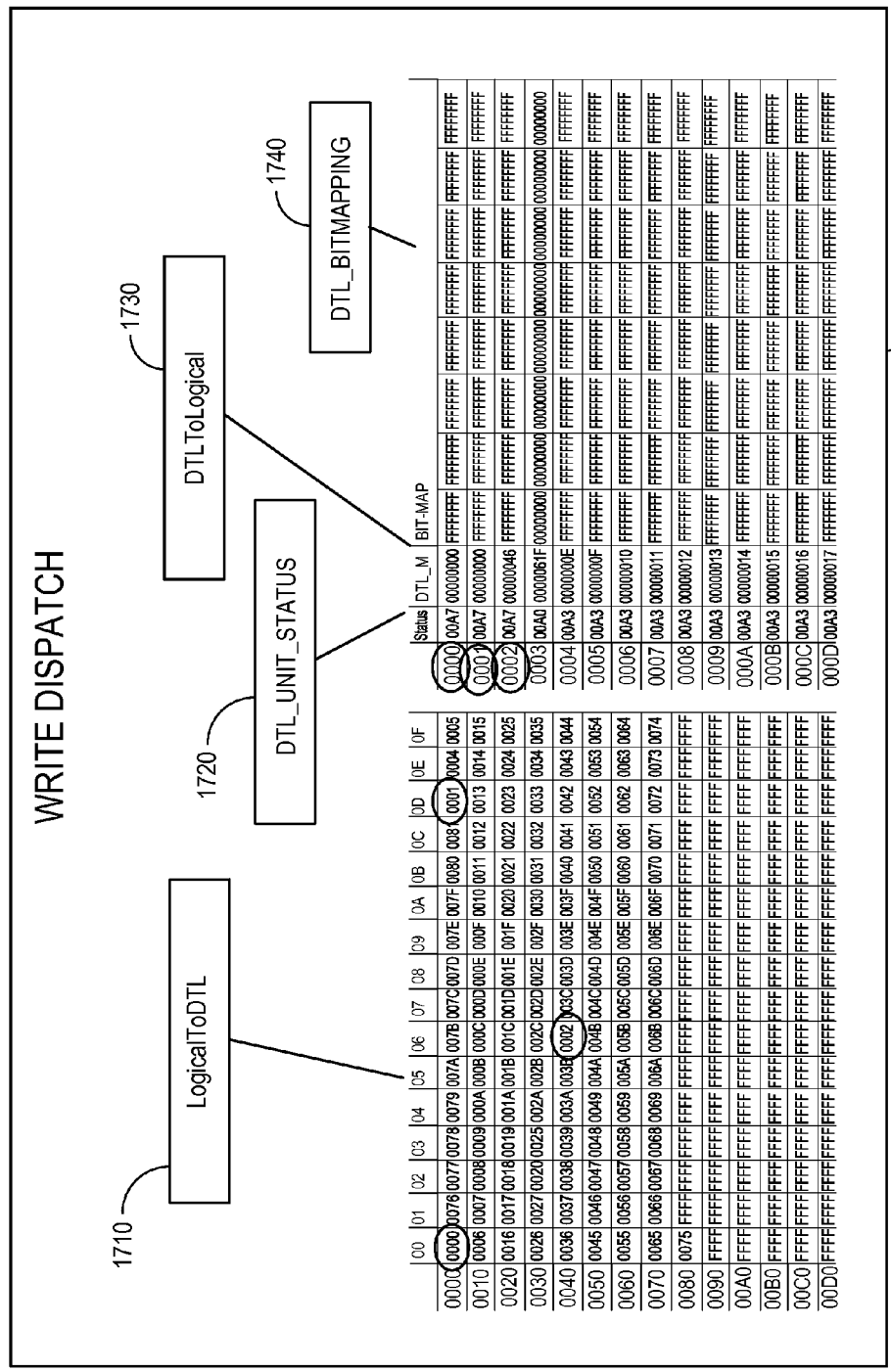
FIG. 17 is an exemplary tabular representation of Write Dispatch Metatables, in accordance with the teachings of the present invention.

Write Dispatch Metatables 1700 are illustrated in FIG. 17. There can be four metatables, for example, used to maintain the DRAM cache. The first table is "Logical to DTL" table 1710. DTL represents "DRAM Translation Layer." Each table entry offset can be the logical address, e.g., in 128K byte units, from "File System Driver" and its content can be the offset starting address, e.g., in 128K byte units, of DRAM cache where the data located. The total entries needed represent the capacity of flash memory device. The remaining three tables all have their respective offset as the starting address of DRAM cache unit, e.g., in 128K byte units. The total entries needed is the total available units of the DRAM cache. The second table is "DTL to Logical" table 1720. Its content is a logical unit address which is the starting address of logical address from "File System Driver," e.g., in 128K byte units. The third table is "DTL_Unit_Status" table 1730. Its content is the status of the corresponding DRAM cache unit. The status bits define the Usage status of each DRAM cache unit. One bit is used for the validity of the data; one bit is used for its flush status; one bit is used for Host Data; one bit is used for writing in the queue; one bit is used for overwrite once; one bit is used for overwrite twice; one bit is used for full data usage of the DRAM cache unit. The fourth table is "DTL_BitMapping" table 1740. Its content is the bit mappings for the 256 sectors of the corresponding DRAM cache unit. Each bit stands for its usage of its corresponding sector in the DRAM cache unit. In the DRAM cache unit, logical '0' stands for empty or invalid data and logical '1' stands for valid data e.g., 256 bits.

Figure 18:
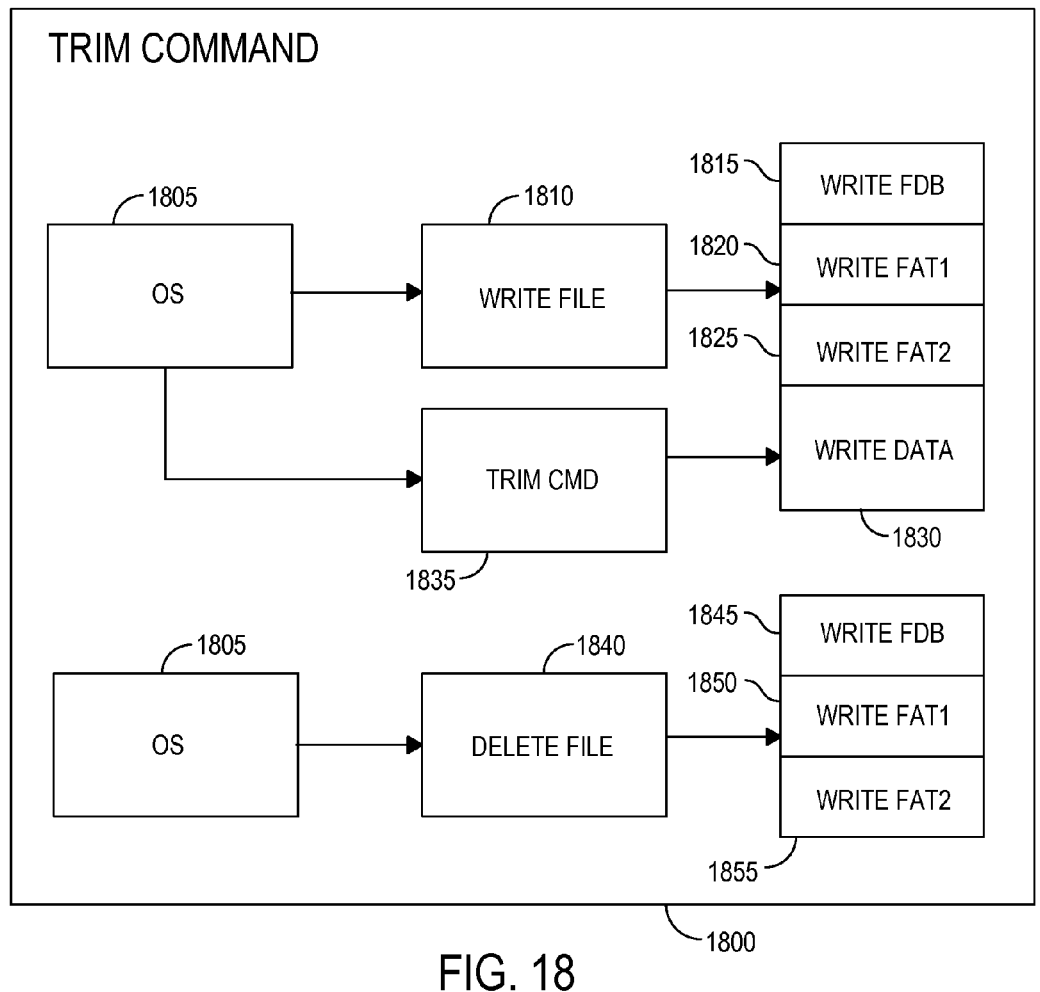
FIG. 18 is a block flow chart illustrating TRIM command functionality, in accordance with the teachings of the present invention.

In FIG. 18, TRIM functionality 1800 for a GNSD driver is illustrated. TRIM 1800 allows an operating system to inform a solid-state drive (SSD) which blocks of data are no longer considered in use and can be wiped internally. SSD generally do not know which sectors/pages are truly in use and which can be considered free space. In a hard disk drive, delete operations are typically limited to flagging data blocks. Although a hard disk drive can erase old data just by overwriting it, TRIM lets the SSD know that the data has been deleted. Without TRIM 1800, the SSD may move data to a new page in a block, wasting time, and causing unnecessary writes to the SSD. Using the GNSD driver 100, the TRIM command can inform the GNSD driver 100 not to flush deleted data to the SSD, eliminating unnecessary writes. This decreases associated write amplification, increasing SSD endurance. A TRIM manager processes a TRIM command 1835 from the file system or OS on host 300. The TRIM command 1835 indicates that a sector is no longer needed by the host and can be wiped or erased. The trimmed page is recorded in the "Page Status Table" as deleted. When doing background garbage collection, if that block is identified as an erase candidate, this page is not be copied to a new block. At that time the TRIM command 1800 can be done. TRIM manager performs overhead such as keeping track of which sectors and pages in a block are no longer needed. A garbage collector may also be used to track blocks that are ready for erasing. Once an entire block is no longer needed, TRIM manager activates the garbage collector or other erase mechanism to erase the block so that the block may be re-used.

Figure 19:
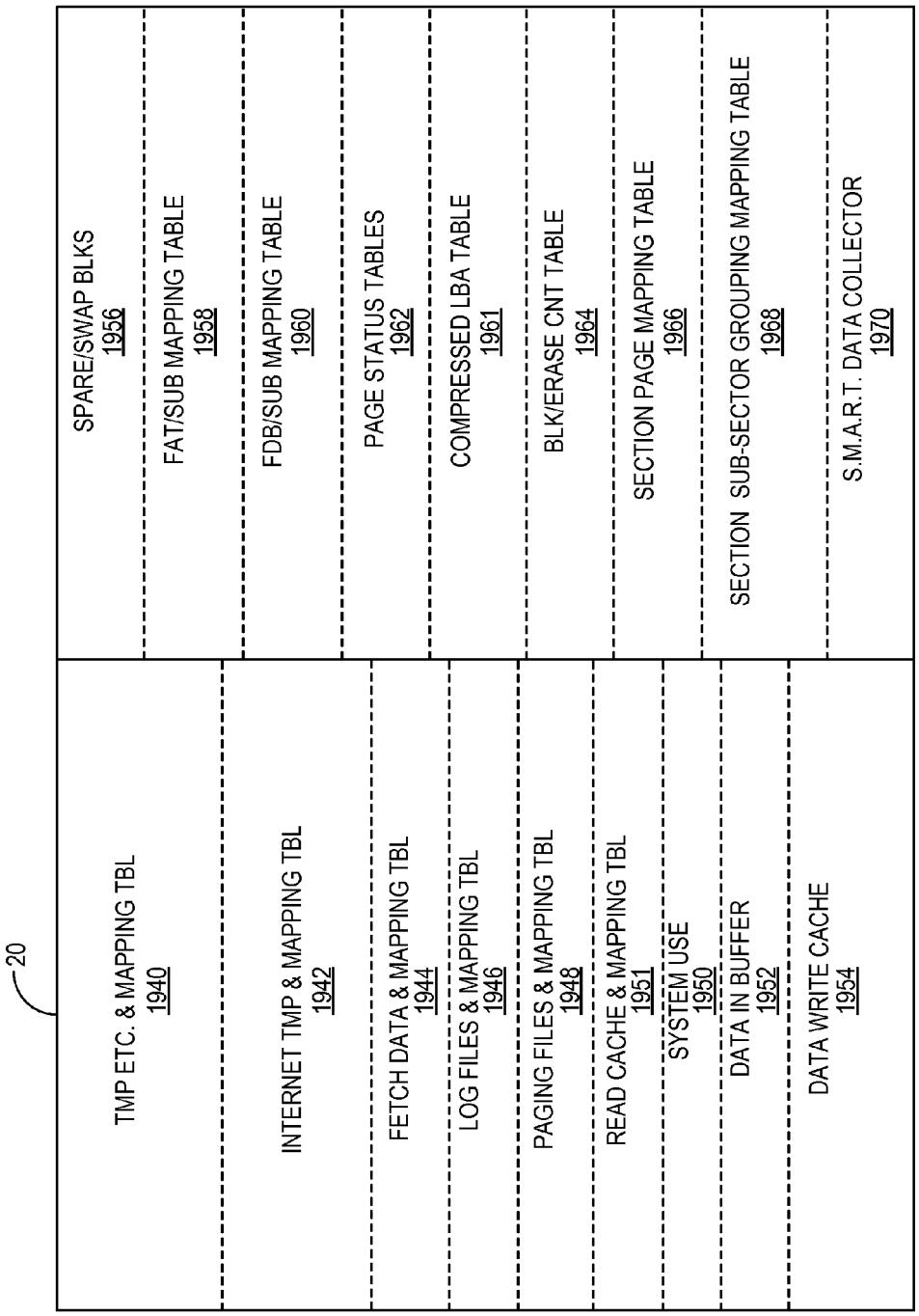
FIG. 19 is a map representation of an Endurance Translation Layer, in accordance with the teachings of the present invention.

In FIG. 19, and also with reference to FIG. 1, an Endurance Translation Layer (ETL) is created in a DRAM buffer in SSD DRAM 194 and provides temporary storage to reduce flash wear. The ETL is provided for by SEED Controller 192 working with DRAM 194 to reduce unnecessary writes to Flash 196. DRAM 20 can represent DRAM buffers found in DRAM 194. The ETL is used to manage the interaction of DRAM 194 and Flash Memory 196, at power up, during normal operation, and at power down. Temp area in DRAM buffer 20 stores temporary files that are identified by controller 192 reading the file extension in the FDB/FAT that is stored in FAT area or FDB area. Temp files are those with well-known extensions, for example of the operating system, a word processor, an Internet browser, a CAD system, or a spreadsheet system. Other applications may use their own unique file extension for temp files. Both areas have a table for locating each temp file. This table may be indexed by the logical address from the host. An ETL can be created in the DRAM buffer that is controlled by the controller. The ETL can be used to provide temporary storage to reduce flash wear. Data can be distributed in the DRAM buffer to form a structure of data distribution in the DRAM buffer for writing new data across several channels of the flash memory, in which the structure can be managed by the controller. By searching a mapping table for a matching entry for the logical address from a standard host write, reading data-type bits and a pointer from the matching entry, and identifying a data-type to be a non-temporary data-type, the controller manages non-temporary data. Pairing SEED SSD with DRAM, includes using the Endurance Translation Layer (ETL) to control access to a flash memory and to a Dynamic Random Access Memory (DRAM) buffer. ETL inspects the blocks of flash memory, and either identifies the block as bad block if the total error bits exceed a preselected high level threshold, or enters the block into weak table if the total error bits exceed a preselected low level threshold. Typically, the weak table is synchronized to the GNSD Driver 100, which can be coupled to the host DRAM 333.

FIG. 19 represents a memory map which is an Endurance Translation Layer (ETL) showing various types of data stored in ETL DRAM 20, which also may be shown in FIG. 1 as SSD DRAM 194. ETL DRAM 20 may represent a portion of SSD DRAM 194. The firmware of SEED controller 192 uses the ETL to manage the interaction of ETL DRAM 20 of DRAM 194 and Flash Memory 196, at power up, during normal operation, and power down. Temp area 1940 in ETL buffer 20 stores temporary files that are identified by reading the file extension in the FDB/FAT that is stored in FAT area 1958 or FDB area 1960. Temp files can be those with extensions of .tmp, .temp, .tmt, .tof, .trs, .tst, etc. System related temp files may include .mp, .log, .gid, .chk, .old, .bak. AutoCAD related temp files may include .SV$, .DWL, .AC$. Word related temp files may include .asd files. Excel related temp files may include .xar files. Other applications may use their own unique file extension for temp files. Internet temp file area 1942 stores files with an extension of .gif, .jpg, .js, .htm, .png, .css, .php, .tmp, .mp3, .swf, .ico, .txt, .axd, .jsp, and .aspx. Both areas 1940, 1942 have a table for locating each temp file. This table may be indexed by the logical address from host 300.

Fetch data area 1944 stores fetch data and a table of entries in fetch data area 1944. Each time a computer is turned on, the Windows® OS keeps track of the way the computer starts and which programs are commonly open. Windows® OS saves this information as a number of small files in the prefetch folder. The next time the computer is turned on, Windows® OS refers to these files to help speed the start process.

The prefetch folder is a subfolder of the Windows® OS system folder. The prefetch folder is self-maintaining, and there's no need to delete it or empty its contents. Log files with an extension of .log or .evt are stored in log file area 1946, which also may have a mapping table for log files stored in this area, or may be considered a type of temp file.

Paging files that swap data between main memory on the host at peripheral storage such as a hard disk or SEED SSD drive 200 are stored and mapped in paging area 1948. A read cache of data read from flash memory 196 and stored in ETL DRAM buffer 20 is placed in read cache area 1951. A mapping table of read cache entries may be used, and include tags, valid bits, and pointers to the data in flash memory 196. System area 1950 stores flash system data used by the operating system of SEED SSD controller 192. Data in buffer 1952 stores the raw host data (including the LBA) being written to SEED SSD drive 200. The actual host data is later moved to data write cache 1954 before being written into flash memory 196. Super write cache technology related to data write cache 1954 is used to cache the write data to flash 196 for the purpose of reducing the number of writes/erases to flash 196 and with Spare/Swap blocks 1956 further to reduce the writes/erases in flash 196.

The data write from host 300 will write into data in buffer 1952 first, then after processing by GNSD driver 100 such as compression, it will write to data write cache 1954, then write to flash memory 196. In the case of a large quantity of data continuously writing from host 300, writes to flash memory 196 may be a bottleneck. The data can be continuously written into data write cache 1954 until it is full, then the flow from data in buffer 1952 to data write cache 1954 will be stopped. If data in buffer 1952 is also full, then host 300 will be notified to stop the traffic.

Data write cache 1954 uses an endurance write cache algorithm that stores write data to ETL DRAM buffer 20 and not flash memory 196 until castout. Thus multiple writes with the same LBA can overwrite the data in data write cache 1954 and write to flash memory 196 in a stripe-ready unit according to the policy (such as based on time elapsed, capacity allocated, etc.) or upon power off or power failure. Data write cache 1954 also holds the partial page write data until the whole page is grouped with multiple partial pages. Thus, multiple partial pages write can write to flash memory 196 according to policy (such as based on time elapsed, capacity allocated, etc.) or upon power off or power failure.

In a multi-channel controller structure, the device controller 192 may write data which is arranged as multiple pages (the number of the multiple may be equivalent to the multi-channel) from data write cache 1954 to flash in a stripe-ready unit when castout to best utilize the flash interface bandwidth. For each device controller 192, it consists of the number of channels C, each channel has a number F of flash chips attached, each chip has D dies in a stack, and each die has P planes. The stripe size can be set to be F*D*P pages. The stripe depth can be set to C*F*D*P pages. The device controller 192 selects the data from data write cache 1954 and writes the data to the selected stripes of flash memory 196, then updates related mapping table entries with corresponding PBA address. Each channel has only one bus, so only one die can be accessed. F*D dies will be interleaved to share the bus to maximize the utilization of the bus. The size of the stripe-ready unit can be C or up to C*F*D*P pages.

An Endurance Translation Layer (ETL) method increases endurance of a flash memory that has a low specified erase-cycle lifetime. A flash memory interface has a multiple of buses for channels; each channel has a multiple of flash chips; each chip has a multiple of dies, and each die has multiple planes. All channels can be accessed at the same time. All dies in the same channel cannot be accessed at the same time; only one die in the same channel can be accessed at a time. Another die in a channel can be accessed when the other die is being written or read. Interleaving writing or reading can increase the performance of flash access. A data write cache is stored in the DRAM buffer and managed by the controller according to a policy. When the dirty data in the data write cache is greater than the stripe-ready unit, the device controller manages the dirty data and writes to the flash memory through the flash memory interface. The device controller manages the distribution of data to each channel of flash memory. The device controller manages the interleaving of data to one die of one chip in each channel, and manages the mapping table entries to track the LBA to PBA mapping.

In other alternate designs, in a multi-channels controller structure, each channel may have its own data write cache 1954. Writing stripe-ready units simultaneously to each flash memory channel can maximize the flash memory interface speed. User file data can be identified as Frequent Access data based on the hit rate of >=n (such as 2) and Non-Frequent Access data of hit rate <n. They may be written to two data write caches 1954 separately. Multiple write data with the same LBA address to a Frequent Access Zone will overwrite the old contents in DRAM that is not in flash so that it reduces the number of writes to flash memory 196. The cache data in the Frequent Access Zone of the data write cache will be stored in flash memory 196 in a stripe-ready unit based on a policy such as based on time elapsed (such as 1 hour), capacity allocated, etc., or upon power off or power failure. The cache data in the Non-Frequent Access Zone of the data write cache will be stored to the flash memory 196 in a stripe-ready unit based on another policy such as based on time elapsed (such as 15 minutes), capacity allocated, etc. or upon power off or power failure.

In the case of LBA address misalignment, the LBA address will be added with an offset to make the LBA address aligned with the page address of flash memory 196 before writing to data write cache 1954 to make the write to flash more efficient later on.

Endurance spare and swap blocks 1956 are used for the garbage collection function to consolidate the valid data and evicted data from the write cache before it is written to flash. Page status tables 1962 contain a table with page status entries, such as an empty page, a used page, a garbage page (TRIMed), a bad page, and a page that needs additional ECC protection. Compressed LBA table 1961 stores mapping entries for compressed user data. Block erase count table 1964 keeps track of erase counters and block status for each physical block in flash memory 196.

Section page mapping table 1966 stores partial-page mapping information. DRAM 20 may not have enough space for the whole mapping table, so only portion of it is loaded to the DRAM. When the LBA table entry is not in the DRAM then it will evict some portion of the partial mapping table and load the related LBA table to DRAM. Section sub-sector grouping mapping table 1968 stores sub-sector mapping information for data files that are less than one page in size. A partial mapping table of sub-sector grouping mapping table 1968 has entries for only 1 of N sets of mapping tables. The other N-1 sets are stored in flash memory and fetched into the DRAM buffer when a partial mapping table miss occurs.

S.M.A.R.T data collector 1970 has data tables and other information used by SMART function 39 from SMART monitor 246 (FIG. 1) and can be requested by the host through SMART commands or vendor commands.

The sizes of the areas in ETL DRAM buffer 20 may be determined by the overall size of ETL DRAM 20, the page size, block size, and sector size of flash memory 196, and whether page mapping or block is used, or an estimate of what percent of the entries in that area are page mapped rather than block mapped. For example, ETL DRAM buffer 20 may be a 512 MB DRAM, with 240 MB allocated to temp area 1940, 160 MB allocated to Internet temp area 1942, 12 MB allocated for fetch data, 6 MB allocated for log files, etc.

In a multi-channel controller structure, the device controller 192 may read data from flash memory 196 and go through the multi-channel structure to various ETL tables (FAT/Sub Mapping Table 1958, FDB/Sub Mapping Table 1960, Page Status Table 1962, compressed LBA Table 1961, block erase count table 1964, Section Page Mapping Table 1966, and Section Sub-Sector Grouping mapping Table 1968).

In a multi-channel controller structure, the device controller 192 may write various ETL tables (FAT/Sub Mapping Table 1958, FDB/Sub Mapping Table 1960, Page Status Table 1962, Compressed LBA Table 1961, block erase count table 1964, Section Page Mapping Table 1966, and Section Sub-Sector Grouping mapping Table 1968) which are arranged as multiple pages, (the number of multiple is equivalent to multi-channel) to flash in stripe-ready units according to a policy (such as based on time elapsed, capacity allocated, etc.) or upon power off or power failure, to best utilize the flash interface bandwidth.

The Green NAND SSD Application 180 and Driver 100 embodiments described herein may have a profound effect on the endurance of an SSD device. Indeed, GNSD driver 100 can provide more than a tenfold improvement of write amplification to the SSD. For example, where a standard TLC SSD may have a standard endurance of 500-1,500 program/erase (P/E) cycles, the embodiments of the invention herein can enhance the endurance to 5,000-15,000 (P/E) cycles on TLC SSD. Also, a multilevel cell (MLC) SSD and a single level cell (SLC) SSD may have their endurance experience a ten-fold improvement over current MLC and SLC SSD standard endurances. Moreover, write amplification is reduced over the standard value for the SSD.

The GNSD driver is not limited to the improvement of the endurance/performance of the SSD. It can also be used to improve other non-volatile storage devices such as, without limitation, an SD, an MMC, an eMMC, an M.2, a Hard Disk Drive (HDD), and a hybrid SSD/HDD.

Although the present invention has been described by way of example with references to the circuit drawings, it is to be noted herein that various changes and modifications will be apparent to those skilled in the art. Therefore, unless such changes and modifications depart from the scope of the present invention, they should be construed as being included therein.

The invention claimed is:

1. A Green NAND Solid State Drive (GNSD) Driver coupled to host DRAM, comprising:
a memory manager, coupled to an Upper filter; and
a data grouper engine coupled to the host DRAM;
a data ungrouper engine coupled to the host DRAM;
a power manager coupled to the memory manager; and
a flush/resume manager coupled to the memory manager,
wherein the GNSD driver is coupled to a GNSD application, and
wherein the host DRAM is coupled to a Non-Volatile Memory Device.

2. The GNSD Driver of claim 1, further comprising one of:
a compression/decompression engine, coupled to a File System filter;
a de-duplication engine, coupled to a File System filter;
an encryption/decryption engine, coupled to a File System filter; or
a high-level error correction code engine, coupled to a Lower filter.

3. The GNSD Driver of claim 2, wherein the encryption/decryption engine is configured to encrypt one of a Data Encryption Standard or an Advanced Encryption Standard.

4. A GNSD Driver coupled to DRAM of a host, comprising:
a data grouper;
a data write cache of the DRAM, coupled to the data grouper;
a data ungrouper; and
a data read cache of the DRAM, coupled to the data ungrouper,
wherein the data grouper and the data ungrouper are coupled to an Upper Filter, and a Lower Filter, and
wherein the GNSD driver is coupled to a GNSD application, and
wherein the DRAM is coupled to a Non-Volatile Memory Device.

5. The GNSD Driver of claim 4, further comprising one of:
a compression/decompression engine, coupled to the File System Filter;
a de-duplication engine, coupled to the File System Filter;
an encryption/decryption engine, coupled to the File System Filter; or
a high-level error correction code engine, coupled to the Lower Filter.

6. The GNSD Driver of claim 4, further comprising:
a SMART data monitor, coupled to a super enhanced endurance device SSD; and
a security engine, coupled to the host.

7. The GNSD Driver of claim 5, wherein the high-level error correction code engine uses one of a graph-based code or an algebraic code.

8. The GNSD Driver of claim 7, wherein the high-level error correction code engine employs a low-density parity code graph-based code.

9. The GNSD Driver of claim 4, wherein the data grouper and data ungrouper are each coupled to:
a metapage grouper for user data;
a metapage grouper for FDB; and
a metapage grouper for pagefile pages.

10. A method of operating a GNSD Driver and a GNSD application coupled to host DRAM of a host, comprising:
coupling Configuration and Register O/S Settings to the host and to the GNSD Application;
coupling a data grouper engine of the GNSD driver to the host DRAM;
coupling a data ungrouper engine of the GNSD driver to the host DRAM;
coupling a power manager of the GNSD driver to the host;
coupling a memory manager of the GNSD driver to the host;
coupling a flush/resume manager of the GNSD driver to the host DRAM; and
coupling the data grouper engine and the data ungrouper engine of the GNSD driver to an Upper Filter and a Lower Filter; and
coupling the DRAM to an Super Enhanced Endurance Device (SEED) SSD; and
one of:
disabling drive indexing, disabling drive search indexing, reducing page file size, disabling system restore, disabling hibernate, disabling prefetch, reducing recycle bin size, disabling defragmentation, reducing logging; and disabling performance monitoring, disabling write caching, or disabling write cache buffer flushing,
wherein SEED SSD endurance is increased to more than specified and write amplification is reduced to less than specified.

11. The method of claim 10, further comprising:
synchronizing a weak table to a weak table of blocks of the SEED SSD;
generating high level error correction code (ECC) data for page data in the weak table, providing generated high level ECC data;
storing the generated high level ECC data in one of a cache area in the host DRAM, or in a spare portion of the SEED SSD; and
writing the page data indicated by the weak table.

12. The method of claim 11, further comprising:
reading data in a page by the ECC engine;
if the data in the page is determined to be corrupted by the SEED SSD native ECC engine:
reading by the ECC engine the generated high level ECC data of the weak table to which the corrupted page data pertains; and
correcting the corrupted page data with the generated high level ECC data using the ECC engine.

13. The method of claim 10, further comprising:
grouping user data into a first metapage;
grouping system FDB into a second metapage;
grouping pagefile pages into a third metapage; and
storing the first second, and third metapages to a SEED SSD storage volume.

14. The method of claim 10, further comprising:
providing an Endurance Translation Layer (ETL) controlling access to flash memory in a SEED SSD and to a DRAM buffer;
inspecting, by the ETL, a block of flash memory, and one of:
identifying, by the ETL, the block as a bad block if the total error bits exceed a predetermined high level threshold, or
entering, by the ETL, the block into a weak table if the total error bits exceed a predetermined low level threshold; and
synchronizing the weak table to the GNSD Driver coupled to the DRAM.

15. A GNSD application coupled to host DRAM, comprising one of:
an SSD housecleaning module coupled to a GNSD driver;
a DRAM allocation module coupled to a GNSD driver;
a driver installation module coupled to a GNSD driver; or
a cache mode on/off switch coupled to a GNSD driver.

16. A computer system host comprising:
a GNSD driver coupled to a data grouper and a data ungrouper in the computer system host;
a GNSD application coupled to the GNSD driver and to the computer system host;
wherein the data grouper and the data ungrouper of GNSD Driver are coupled to an Upper Filter and a Lower Filter of the computer system host, and
the computer system host is coupled to a Non-Volatile Memory Device.

17. The computer system host of claim 16, further comprising Configuration and Register O/S Settings coupled to the computer system host.

18. A method of increasing endurance of a non-volatile flash memory, comprising:
coupling a GNSD Driver having an ECC engine to host DRAM;
coupling a SEED SSD to host DRAM;
generating high level ECC for selected data in the SEED SSD using the host DRAM; and
using the high level ECC to correct corrupted data from the SEED SSD.

19. The method of increasing endurance of claim 18, further comprising:
synchronizing a weak table to a weak table of blocks with the SEED SSD;
generating high level error correction code (ECC) data for page data in the weak table, producing generated high level ECC data;
storing the generated high level ECC data in one of a DRAM cache area or a spare portion of the SEED SSD; and
writing the page data indicated to the weak table.

20. The method of increasing endurance of claim 18, further comprising:
reading data in a page;
if the data in the page is corrupted by the SEED SSD native ECC engine;
reading the generated high level ECC data of the weak table to which the page pertains; and
correcting the corrupted data in the page with the generated high level ECC data.

* * * * *